(12) United States Patent
Cardosa et al.

(10) Patent No.: US 7,071,854 B1
(45) Date of Patent: Jul. 4, 2006

(54) HARDWARE-IMPLEMENTED LZW DATA DECOMPRESSION

(75) Inventors: Carlos Cardosa, Philadelphia, PA (US); Thomas J. Kelleher, Jr., West Chester, PA (US); Shahriar Seyedhosseini, Chadds Ford, PA (US); Anil Varghese, Philadelphia, PA (US)

(73) Assignee: Unisys Corporation, Blue Bell, PA (US)

( * ) Notice: Subject to any disclaimer, the term of this patent is extended or adjusted under 35 U.S.C. 154(b) by 206 days.

(21) Appl. No.: 10/435,647

(22) Filed: May 9, 2003

Related U.S. Application Data

(60) Provisional application No. 60/379,812, filed on May 13, 2002.

(51) Int. Cl.
 *H03M 7/40* (2006.01)
(52) U.S. Cl. .............................. 341/67; 341/51; 341/87
(58) Field of Classification Search ................ 341/51, 341/50, 67, 87, 60, 65, 63; 710/68; 709/247; 375/240, 241, 377
 See application file for complete search history.

(56) References Cited

U.S. PATENT DOCUMENTS

| | | | | |
|---|---|---|---|---|
| 5,704,022 A * | 12/1997 | Ethington et al. | ......... | 358/1.16 |
| 5,818,873 A * | 10/1998 | Wall et al. | ................... | 375/240 |
| 5,951,623 A * | 9/1999 | Reynar et al. | .............. | 708/203 |
| 6,054,943 A * | 4/2000 | Lawrence | ..................... | 341/87 |
| 6,307,488 B1 * | 10/2001 | Cooper | ......................... | 341/51 |
| 6,392,568 B1 * | 5/2002 | Cooper | ......................... | 341/51 |
| 6,404,362 B1 * | 6/2002 | York et al. | ................... | 341/106 |
| 6,438,631 B1 * | 8/2002 | Kawase | ....................... | 710/68 |
| 6,577,254 B1 * | 6/2003 | Rasmussen | .................. | 341/51 |
| 6,611,213 B1 * | 8/2003 | Bentley et al. | ............... | 341/51 |
| 6,624,762 B1 * | 9/2003 | End, III | ....................... | 341/51 |
| 6,686,857 B1 * | 2/2004 | LoCasale et al. | ........... | 341/110 |
| 2002/0101367 A1 * | 8/2002 | Geiger et al. | ................. | 341/51 |

* cited by examiner

*Primary Examiner*—Linh V. Nguyen
(74) *Attorney, Agent, or Firm*—Lise A. Rode; Mark T. Starr; Werner & Axenfeld

(57) ABSTRACT

An apparatus for performing LZW data decompression in hardware is described. In one exemplary implementation, the apparatus includes processing modules configured to decompress compressed data using an LZW data decompression algorithm. Operations associated with decompressing the compressed data are segmented into stages. For each particular stage, one or more of the processing modules are assigned to perform operations appurtenant to that particular stage and collectively decompress the compressed data. Each processing module is implemented in hardware and configured to operate independently with respect to the operations appurtenant to that processing module.

21 Claims, 16 Drawing Sheets

|          | State 0 | State 1 | State 2 | State 3 | State 4 | State 5 | State 6 | State 7 |
|----------|---------|---------|---------|---------|---------|---------|---------|---------|
| Count 9  | 7       | 0       | 1       | 2       | 3       | 4       | 5       | 6       |
| Count 10 | 6       | 7       | 0       | 1       | 2       | 3       | 4       | 5       |
| Count 11 | 5       | 6       | 7       | 0       | 1       | 2       | 3       | 4       |
| Count 12 | 4       | 5       | 6       | 7       | 0       | 1       | 2       | 3       |

Fig. 5

HARDWARE-IMPLEMENTED LZW DATA DECOMPRESSION

CROSS-REFERENCE TO RELATED APPLICATIONS

This non-provisional utility application is based on provisional U.S. Patent Application Ser. No. 60/379,812, filed on May 13, 2002, entitled "LZW Decompression In Hardware", which is incorporated by reference herein, and to which priority is hereby claimed.

TECHNICAL FIELD

This invention relates to LZW data decompression.

BACKGROUND

LZW (Lempel-Ziv-Welch) is a popular loss-less compression/decompression algorithm used to reduce large quantities of data, such as data files, text files, digital images, executable code and many other types of data. Reducing the size of data through LZW compression permits data to be more easily transferred from one device to another, such as over a network or point-to-point connection. LZW compression also reduces the amount of storage area needed to store data on a storage medium.

Once the compressed data is sent to another device or is read from a storage medium, the compressed data is "decompressed," i.e., returned to its original state prior to being compressed. While the LZW algorithm reduces data sizes, systems used to perform LZW decompression are often too slow to effectively perform decompression. In many instances, the systems rely on software operating on a general-purpose processor to perform the LZW decompression. Current LZW decompression systems often take too long to perform decompression. Such systems (software operating on general-purpose processor) are usually consumed with other tasks and are unable to dedicate enough resources to perform LZW decompression in a timely enough manner, especially when the compressed data is the form of real-time streaming data such as digital images from a video stream. Moreover, the LZW software code used to perform decompression on a processor usually takes too many cycles to execute, causing data to be decompressed too slowly for many applications. As a result, the quality of data may be substantially degraded in certain applications, such as real-time digital image streaming. In other applications, delayed decompression may result in slower downloads of files and execution of executable code, and so forth.

SUMMARY

An apparatus for performing LZW data decompression in hardware is described. In one exemplary implementation, the apparatus includes processing modules configured to decompress compressed data using an LZW data decompression algorithm. Operations associated with decompressing the compressed data are segmented into stages. For each particular stage, one or more of the processing modules are assigned to perform operations appurtenant to that particular stage and collectively decompress the compressed data. Each processing module is implemented in hardware and configured to operate independently with respect to the operations appurtenant to that processing module.

BRIEF DESCRIPTION OF THE DRAWINGS

The detailed description is described with reference to the accompanying figures. In the figures, the left-most digit(s) of a reference number identifies the figure in which the reference number first appears.

FIG. 5 shows a Table depicting the relationship between a counter and States of a state machine shown in FIG. 4.

DETAILED DESCRIPTION

Introduction

To overcome the inefficiencies and problems described in the Background section above, the following description introduces the broad concept of performing LZW decompression through a hardware-implemented apparatus in which LZW decompression is segmented into stages. For each particular stage, one or more customized processing modules are assigned to perform operations appurtenant to that particular stage and collectively decompress the compressed data. Operations for each of the stages can therefore be performed concurrently, similar to a pipelined system, thereby greatly increasing the speed of performing LZW decompression when compared to more traditional software-based systems. Preliminary results suggest that the hardware-implemented apparatus, is at a minimum, 2½-to-5 times faster than most current LZW decompression systems operating on similar platforms.

As used herein, "LZW data decompression" means a portion of the LZW (Lempel-Ziv-Welch) algorithm used to decompress data that was previously compressed using a portion of the LZW algorithm for data compression. The data itself, may be in any format or language used to compress/decompress data including, but not limited to, PostScript®, PDF®, TIFF, GIF, V.42bis, as well as proprietary compression methodologies that rely on the LZW algorithm to perform data compression/decompression. In other words, the hardware-implemented apparatus to be described herein supports any type of data/language format employing LZW, and is thus considered data/language format agnostic. Accordingly, the hardware-implemented apparatus is easily ported for use with many different types of data/language formats that incorporate the LZW algorithm.

It is assumed that the reader is familiar with the LZW algorithm. Accordingly, the LZW algorithm and some of the common definitions used to describe the LZW algorithm shall not be explained herein. For a more detailed understanding of the algorithm, it is suggested the reader review U.S. Pat. No. 4,558,302 to Welch, incorporated herein by reference.

Example LZW Data Decompression Environment

Figure 1:
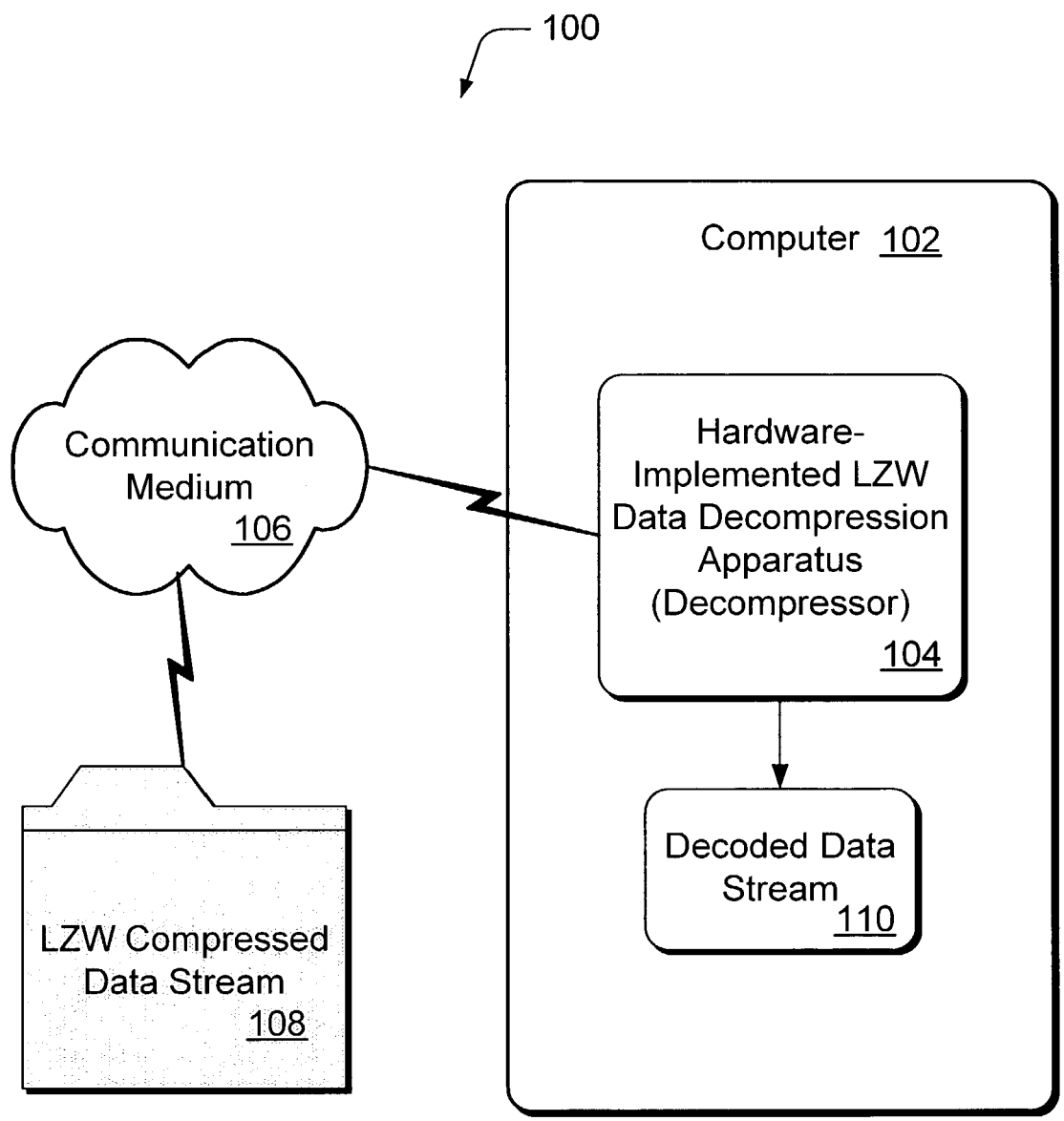
FIG. 1 shows an exemplary environment in which a computer employing a hardware-implemented LZW data decompression apparatus may be implemented.

FIG. 1 shows an exemplary environment 100 in which a computer 102 employing a hardware-implemented LZW data decompression apparatus 104 (referred to generally as "decompressor 104") may be implemented. Computer 102 represents various different general purpose or special purpose computing system configurations, including but not limited to personal computers, server computers, hand-held or laptop devices, portable communication devices, tablet PCs, televisions/set-top boxes, wireless devices, printers, photocopiers, multiprocessor systems, microprocessor systems, microprocessor-based systems, programmable consumer electronics, gaming systems, multimedia systems, the combination of any of the above example devices, and other smart devices. Other elements such as power supplies, keyboards, touch pads, displays, LEDs, audio generators, vibrating devices, and so forth are not shown in FIG. 1, but could easily be a part of computer 102.

Computer 102 may be connected to a communication medium 106 capable of transferring compressed data to computer 102. The communication medium 106 is intended to represent any of a number of typical communication links including, but not limited to, a proprietary data bus, an industry standard data bus, a local area network (LAN), a wide area network (WAN), global area network (e.g., the Internet), a wireless link, or some type of other communication link. Furthermore, the communication medium 106 may reside within computer 102 such as an internal link used to transfer data from a storage medium.

Decompressor 104 decompresses compressed data using LZW data decompression. Decompressor 104 is depicted as residing in computer 102, but may be implemented as a separate device external to computer 102. Decompressor 104 is implemented in hardware and is used as an interface between computer 102 and communication medium 106. For instance, decompressor 104 may be implemented as one or more chips on a printed circuit board (not shown). Decompressor 104 may also be packaged as a separate device and used as an interface between computer 102 and communication medium 106. Decompressor 104 may also be implemented in other hardware-implemented configurations, such as a smart card or some type plug-in-and-play style device.

Decompressor 104 receives compressed data (such as LZW code-words) 108 from communication medium 106 and decompresses compressed data 108 into a decoded data stream (also referred to as character strings) 110. The decoded data stream 110 may be transmitted to other components within computer 102 or to another device via communication medium 106.

Decompressor Architecture

Figure 2:
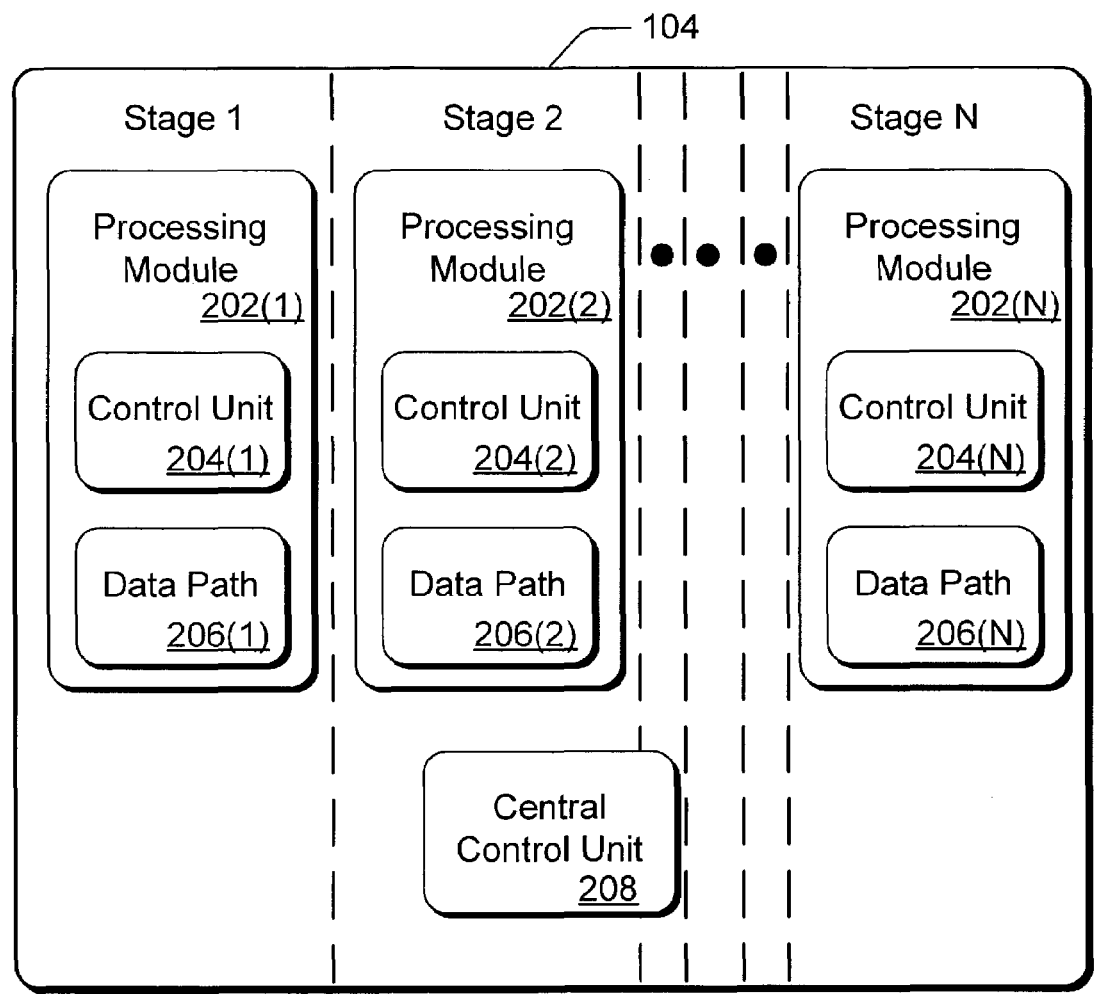
FIG. 2 illustrates a block diagram of a more detailed representation of the LZW data decompression apparatus shown in FIG. 1.

FIG. 2 illustrates a block diagram of a more detailed representation of decompressor 104 shown in FIG. 1. Deompressor 104 includes processing modules 202(1), . . . , 202(N). Each of the processing modules, referred to generally as reference number 202, are individual processors implemented in hardware and are intended to represent any broad range of hardware devices known in the art. In one implementation, processing modules 202 are implemented as self-executing special-purpose programmable logic arrays in the form of a FPGA (Field Programmable Gate Array). While in other embodiments, processing modules 202 may be implemented as one or more ASICs (Application Specific Integrated Circuit), or other hardware-based technology including hybrid circuit and programmable logic technologies.

In one implementation, each processing module 202 includes a control unit referred to generally as reference number 204. Each control unit 204 is responsible for communicating with other devices and/or processing modules. Each control unit 204 is also responsible for the flow of data to and from its respective processing module. Processing modules 202 may also rely on a centralized control unit 208 for housekeeping operations, such as initializing the decompressor 104, handling error conditions, and other duties that generally fall outside the scope of each respective processing module 202.

In one implementation, each processing module 202 also includes a data path referred to generally as reference number 206. Each data path 206 handles the flow of data through their respective processing modules. Each data path 206 may include other devices such as registers, busses, and buffers, examples of which shall be described in more detail below. Each of the data paths 206 may be controlled by their respective control units 204 or receive some of their control from centralized control unit 208.

By having their own control units and data paths, each processing module 202 is self-reliant and is capable of working independently from other processing modules. That is, so long as a particular processing module is offered data to process, the processing module is autonomous and does not rely on external control to perform operations associated with processing data. Additionally, each of the processing modules 202 is capable of functioning concurrently with other processing modules 202. Because functionality of each processing module 202 is achieved through hardware-based components/logic, each processing module 202 does not have to wait for coded soft instructions to run in order to achieve functionality. Additionally, each of the processing modules may be configurable through programmable logic arrays, such as when implemented in an FPGA format.

Decompressor 104 decompresses compressed data using LZW data compression. Referring to the architecture of FIG. 2, this is accomplished by segmenting operations associated with decompressing the compressed data into Stages 1, 2, 3, . . . , N. For each stage, one or more of the processing modules 202 are assigned to perform those operations associated with a particular stage. For instance, in one embodiment stage 1 may represent operations associated with receiving compressed data prior to being decompressed. Accordingly, processing module 202(1) is assigned to perform operations appurtenant to Stage 1, which means processing module 202(1) is configured to perform those operations appurtenant to managing receipt of compressed data. Stage 2 may represent operations associated with identifying LZW code-words. Accordingly, processing module 202(2) is assigned to perform operations appurtenant to Stage 2, i.e., identifying LZW code-words. Stage N may include operations associated with decoding LZW code-words. Accordingly, processing module 202(N) is assigned to perform operations appurtenant to stage N, i.e., decoding LZW code-words, and so forth.

The quantity of stages and the quantity of processing modules assigned to perform operations appurtenant to that stage is variable. Generally, the more stages used to segment operations, the quicker each stage can be completed, because there are less operations that need to be handled by that particular processing module.

Example Three-Stage Decompressor

Figure 3:
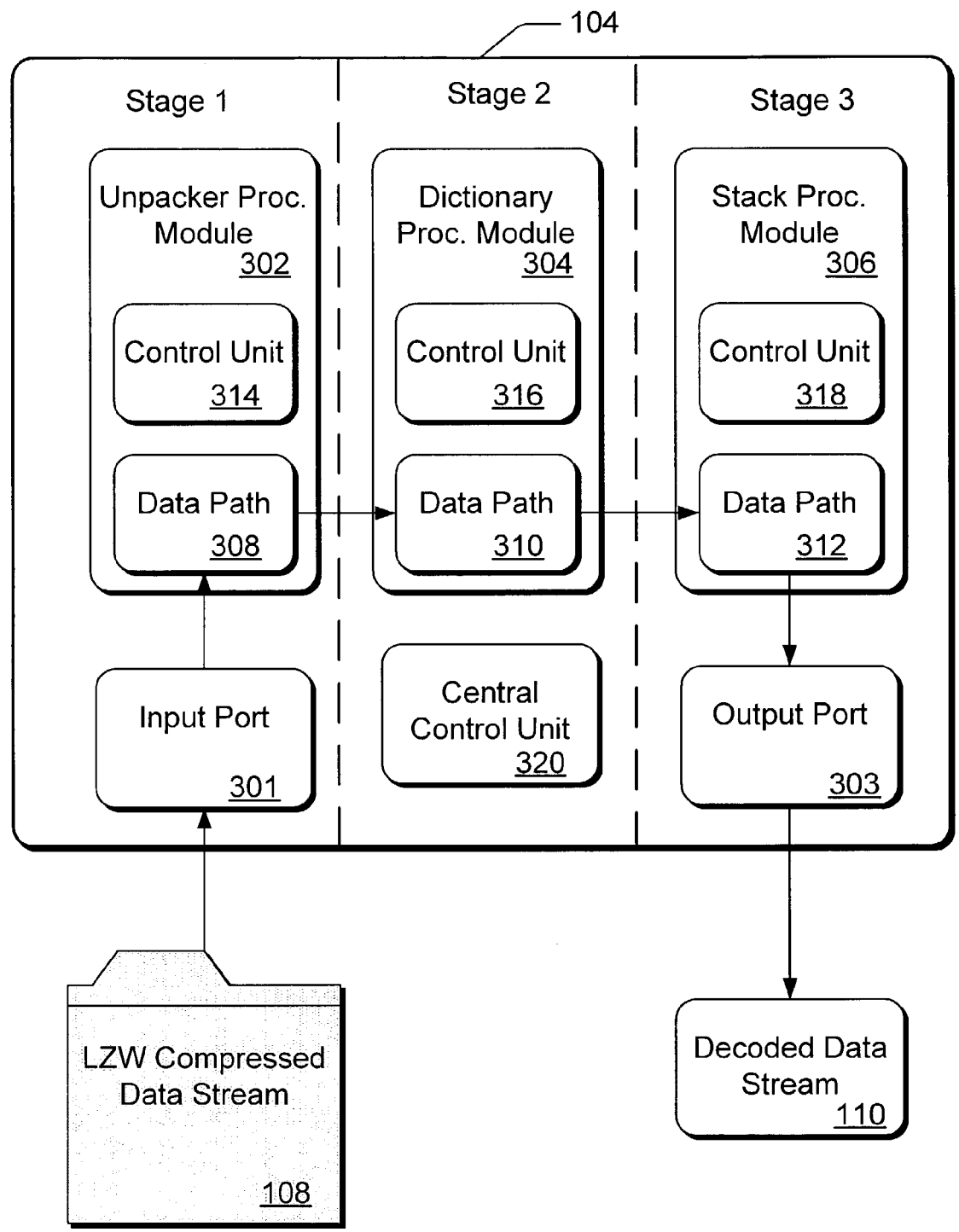
FIG. 3 illustrates a block diagram of an example decompressor suitable for use with a computer.

FIG. 3 illustrates a block diagram of an example decompressor 104, suitable for use with computer 102. An LZW compressed data stream 108 enters decompressor 104 via input port 301. LZW compressed data stream 108 is decoded (i.e., decompressed) by decompressor 104 and transmitted in the form of a decompressed data stream 110 via output port 303. The decompressed data stream 110 matches the original form of the data prior to being compressed using LZW data compression.

In one implementation, operations associated with performing LZW decompression are segmented into three stages: Stage 1, Stage 2 and Stage 3. In Stage 1, operations associated with unpacking LZW code-words from a compressed data stream are performed. In other words, code-words are extracted from the LZW compressed data stream 108 in Stage 1. As appreciated by those skilled in the art, "code-words" are a collection of variable length bits used to encode data on the compression side of the algorithm. In the exemplary implementation the variable length ranges from 9-to-12 bits in length.

In Stage 2, operations associated with generating (i.e., creating) a dictionary to decode code-words associated with the compressed data are performed. Operations associated with decoding the code-words by referencing the dictionary are also performed.

In stage 3 operations associated with buffering decoded data prior to the decoded data being sent to an external device are performed. Also performed in Stage 3, are operations associated with assembling the decoded data so that the decoded data matches the compressed data prior to being compressed. In other words, data output from the dictionary may not be in correct order, so Stage 3 involves organizing and assembling the decoded data from Stage 2, and then transmitting the decoded data, in the form of a decompressed data stream 110, to another device.

Decompressor 104 includes three processing modules, an unpacker-processing module 302, a dictionary processing module 304, and a stack processing module 306. Each of the processing modules 302, 304, and 306 contain their own data paths 308, 310, and 312, respectively. Each of the processing modules 302, 304, and 306 contain their own control units 314, 316, and 318, respectively. Decompressor 104 may also include a central control unit 320 for housekeeping operations as described with reference to central control unit 208 in FIG. 2.

Referring to FIG. 3, unpacker-processing module 302 is responsible for performing operations appurtenant to Stage 1, which includes unpacking code-words (i.e., extracting code-words) from the compressed data stream 108 and transmitting the extracted code-words to the dictionary-processing module 304. According to the LZW compression algorithm, the output of an LZW compressor typically range from 9 bits to 12 bits long. When sending the compressed code-words, LZW compression packs the words into groups of 8 bits. Therefore, in the decompressor 104, the unpacker-processing module 302 will reconstruct (i.e. extract) the code-words from the 8-bit input words (bytes).

Dictionary processing module 304 is responsible for performing operations appurtenant to Stage 2, which includes (i) generating a dictionary to decode code-words associated with the compressed data, and (ii) decoding the code-words by referencing the dictionary. That is, dictionary-processing module 304 generates a string table from the incoming code-words received from unpacker-processing module 302 and sends the strings to the stack-processing module. Dictionary processing module 304 transmits a decoded data stream (strings) but as shall be explained, this decoded data stream may not be in proper order. For example, in one implementation, strings are read from the dictionary-processing module 304 from the least significant byte to the most significant byte and sent from the output one byte at a time. However, bits should flow from the most significant bit to least significant bit out of the decompressor 104 to the decompressed data stream 110.

Accordingly, stack-processing module 306 is responsible for performing operations appurtenant to Stage 3, which includes assembling the decoded data stream from dictionary processing module 304, for transmission to another device. Since the dictionary-processing module 304 sends strings from the least significant byte to the most significant bye, the stack-processing module 306 reverses these strings. Stack-processing module 306 is capable of temporarily storing an entire string and reading the string out from the most significant byte to the least significant byte. In LZW compression, strings can vary anywhere from one byte to 4k bytes long. In the exemplary implementation, stack-processing module 306 is configured to store a full 4k byte length string in a storage medium until ready to be received by another device. In other embodiments, different string lengths that are larger or smaller may be implemented.

Stack-processing module 306 is also responsible for controlling transmission of the decoded data stream 110 to another device. For example, stack-processing module 306 is designed to hold multiple strings of variable lengths in a storage medium, and stack-processing module is configured to receive and send bytes at the same time. So as one string is being entered into the storage medium for stack-processing module 306, a previous string is being read out. In the exemplary implementation, both the input port 301 and the output port 303 support 8-bit words (bytes).

Although the exemplary implementation is shown to include these three processing modules, it may be possible to implement decompressor 104 without having the exact division of responsibilities as described above with respect to FIG. 3. For instance, it may be possible to combine operations described in Stages 2 and 3 and assign one processing module to carryout those combined operations. Alternatively, it is also possible to add more stages by further segmenting operations performed in particular stages. It may also be possible to add additional processing modules per stage in parallel with the processor modules 302, 304, and 306, to provide more throughput per stage. For instance using two or three similar processing modules per stage provides more throughput per stage.

Exemplary Unpacker-Processing Module 302

Figure 4:
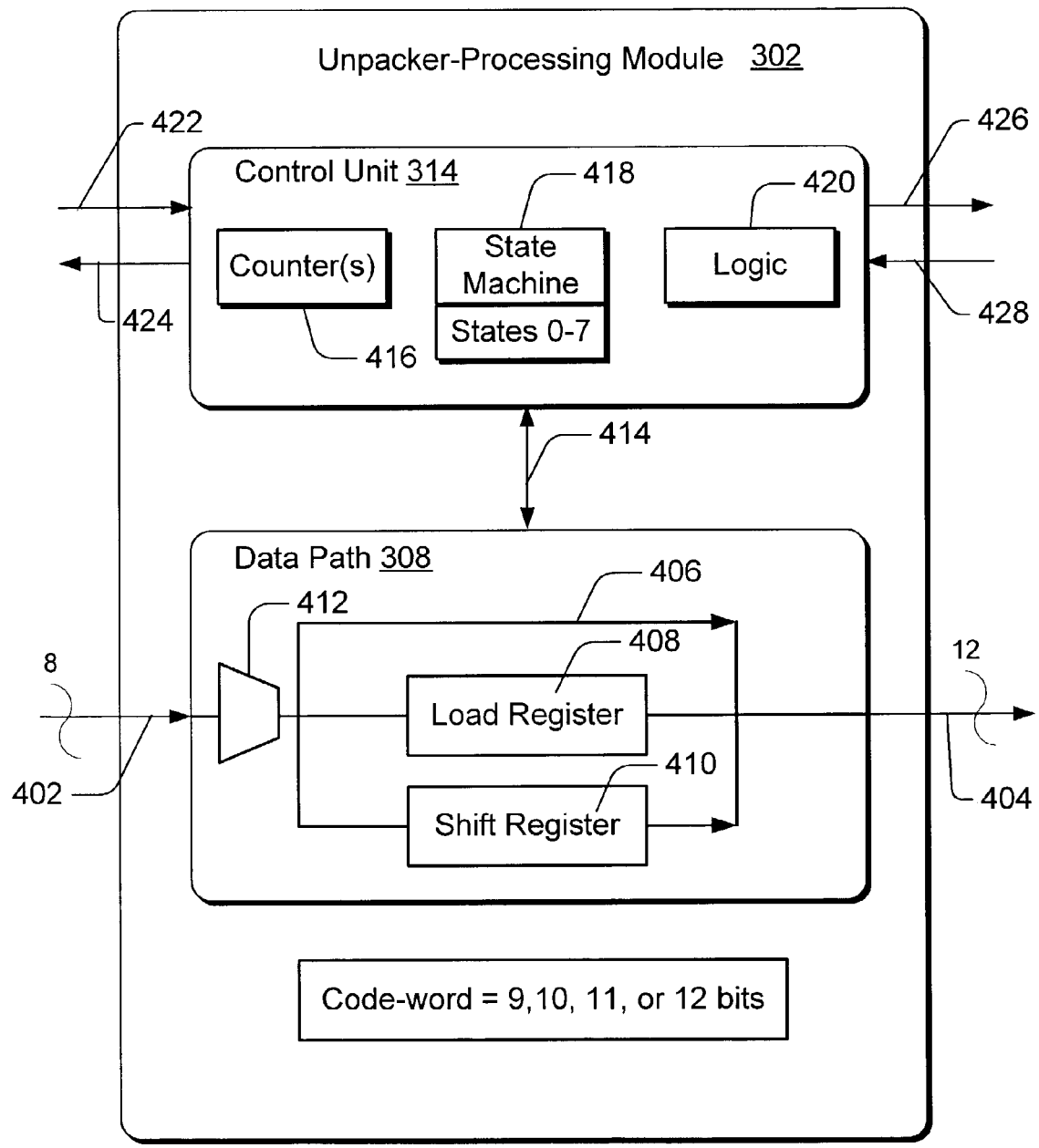
FIG. 4 is a block diagram of an unpacker-processing module shown in FIG. 3.

FIG. 4 is a block diagram of unpacker-processing module 302 shown in FIG. 3. Unpacker-processing module 302 includes a data path 308 and control unit 314. In the exemplary implementation, both the control unit 314 and data path 308 are implemented in a FPGA, but could easily be implemented in other hardware configurations as described above. Data path 308 includes an input path 402 and an output path 404. Input path 402 is 8 bits wide and output path 404 is 12 bits wide. Data path 308 also includes a point-to-point connection 406, a load register 408, and shift register 410, collectively connected in parallel between input path 402 and the output path 404. Point-to-point connection 406, load register 408, and shift register 410 are each 8-bits wide, respectively. Data path 308 also includes a mulitplexer 412 that enables any portion of data entering input path 402 (including a byte) to be selected to pass to output path 404 on the point-to-point connection 406, load register 408, and/or shift register 410. Multiplexer 412 is controlled by control unit 314 via one or more signals (represented as 414) conveyed from control unit 314 to data path 308. This enables how incoming bytes are apportioned to point-to-point connection 406, load register 408, and/or shift register 410.

Input path 402 is configured to receive LZW compressed data eight bits (1-byte) at a time, i.e., per cycle. As used herein, a "cycle" means one unit of operation, such as the number of bits received from the LZW compressed data stream 108 per request. At the output path 404 of data path 308, data is transmitted to the dictionary-processing module 304, 12 bits at a time with code-words embedded therein. Each code-word ranges between 9 and 12 bits. So, each word received by input path 402 is only a portion (8-bits) of a code-word (between 9 and 12 bits) and all outputs from the output data path 404 are 12 bits regardless of the code-word size. Furthermore, in addition to having variable data bit lengths, each code-word may be located at arbitrary positions within the LZW compressed data stream making it even more difficult to extract code-words.

Therefore, to extract code-words, unpacker-processing module 302 typically has to concatenate bits received in a first cycle with bits received from a second cycle. That is, unpacker-processing module 302 will transmit 12 bits of data from output data path 404 when data is available to be sent. This will include bits received from a current cycle, with bits saved from a previous cycle. Shift register 410 is used to save a portion of bits from a current cycle to be concatenated with bits received from a next cycle. Point-to-point connection 406 is used to send a portion of bits received (via input path 402) during a current cycle with bits stored in shift register 410 saved from a previous cycle. Load register 408 is used to store an entire input of 8-bits from input path 402 during a current cycle when there are no bits saved in the shift register 410 from a previous cycle or when there are not enough bits saved in the shift register 410 from a previous cycle to satisfy a next code word.

In one implementation, control unit 314 includes a counter 416, a state machine 418, and logic 420. Counter 416 is used to count code-words. There are a known number of code-words per LZW decompression session. As used herein a "decompression session" means a block of data bounded by codes such as, but not limited to, a "Clear-Code" at the beginning and an "End-of-Information" (EOI) at the end. In other words, a decompression session represents a contiguous block of data from the LZW compressed data stream that needs to be decoded. Counter 416 is used to count code-words in a decompression session. As shall become apparent, the count maintained by counter 416 is used in conjunction with state machine 418 to control data path 308. Counter 416 initiates its count at zero, when it receives a Clear-Code signal. Based on the counter 416 a pattern emerges as follows: 9-bit code-words are transmitted by the unpacker processing module 302 to dictionary processing module for counts between 0–255; 10-bit code-words are transmitted by the unpacker processing module 302 to dictionary processing module for counts between 256 and 767; 11-bit code-words are transmitted by the unpacker processing module 302 to dictionary processing module 304 for counts between 768 and 1790; and 12-bit code words are transmitted by unpacker-processing module 302 to dictionary-processing module 304 for counts between 1790 and 3839. This pattern shall be referred to again with reference to FIG. 5.

State machine 418 includes eight States: Value States 0–7. Each of the Value States are described in more detail with reference to FIGS. 5–13. The number of bits saved in shift register 410 after each cycle indicates and corresponds to what State is activated by state machine 418. For example, suppose that there are two bits (0 & 1) stored in shift register 410 during the present cycle. Then, for the next cycle, State 2 (binary one) will be initiated by State machine 418. If there is no bits in shift register 410 after a current cycle, then state-machine 418 will activate State 0 for the next cycle. Thus, each State 0–7 is initiated based on the number of bits left over in shift register 410 from any previous cycle, unless a Clear-Code or EOI signal is received.

Along with each State (0–7), state machine 418 maintains a state for counter 416, indicative of whether 9-bit code-words, 10-bit code-words, 11-bit code-words, or 12-bit code-bits are being counted. As shall be described with reference to FIGS. 5–13, this provides a basis for how many bit words received from input path 402 need to be concatenated with bits stored in registers 408 and 410.

FIG. 5 shows a Table 500 depicting the relationship between counter 416 and States 0–7 for State machine 418. In particular, Table 500 depicts a pattern 502 that is used by state machine 418 to perform operations necessary to extract code-words from LZW Compressed Data Stream 108. The top row 504 serves as a header and shows eight possible states for State Machine 418: States 0–7 for each column. Again, State=0 means that in the previous cycle no bits were stored in the shift register 410, State=1 means that in the previous cycle 1 bit was stored in the shift register 410, etc. There are four rows with each row specified by the state of counter 416 in the left most column 506. Thus, the row "Count 9", indicates that counter 416 is counting 9-bit code-words or, in other words, a nine-bit code word is being output by unpacker processor module 302. Row "Count 10" indicates that counter 416 is counting 10-bit code-words, and so forth. Within each row and column is a number, which corresponds to the next State of State Machine 418. This number also corresponds to the number of bits stored in shift register 410 for the next cycle. For example, State 0, Row "Count 9", indicates that 7 bits are to be stored in the shift register 410, next cycle, and State Machine 410 will also perform State 7 next cycle.

Thus, referring to FIGS. 4 and 5, control unit 314 is configured to extract code-words from the LZW compressed data stream by monitoring patterns, such as described with reference to FIG. 5, associated with each increment of 8 bits of data (byte) received by the data path 402 per cycle. Based on those patterns, the control unit 314 is able to direct the data path 308 via control signals 414 to form a code-word from a portion of the compressed data stream (8 bits versus 9, 10, 11 or 12 bit code-words) for transmission from output path 404. That is, control unit 314 determines how many of the 8 bits received by the data path 308 per cycle should be stored in load register 408, stored in shift register 410, concatenated with previously stored bits in either load register 408 and/or shift register 410 and/or directly output to the output path 404 via point-to-point connection 406. Control unit 314 recognizes that there is a specific number of 9, 10, 11, and 12 bit code-words of compressed data. Therefore, by keeping track of the number of unpacked code-words, control unit 314 is able to determine how many bits from compressed data stream need to be concatenated per cycle with bits stored from previous cycles.

Referring to FIG. 4, control unit 314 also uses request and acknowledge handshaking signals to control receipt of the LZW compressed data 108 via input path 402 and transmission of extracted code-words via output path 404. That is, when ready to receive data, control unit 314 waits to receive a request signal 422 from another device (not shown) or interface (such as a buffer) within decompressor 104 indicating the other device is ready to send compressed data. When compressed data is received by data path 308, control unit 314 sends an acknowledge signal 424 to the other device. Likewise, control unit 314 uses a request signal 426 to inform dictionary-processing module 304 when unpacker-processing module 302 is ready to send extracted code-words. An acknowledge signal 428 to control unit 314 indicates when dictionary-processing module 304 successfully received an unpacked code-word.

Logic 420 provides the ability for control unit 314 to perform rudimentary comparisons of bytes received from LZW compressed data stream 108 to determine whether these bytes are indicative of a clear-code or EOI. Logic 420 may be implemented directly in the data patch 308, although it is depicted as being part of the control unit 314.

It should be noted also that in an alternative implementation, a ROM (not shown) or some other non-volatile memory medium could be used in place of counter 416 and/or state machine 418. Each of the States (0–7) in state machine 418 may be hard coded in the ROM such that the content of the ROM at each location determines the next State (next ROM Address). This implementation uses less logic to implement than counter 416 and/or state machine 418 because next States are already determined and no decisions need to be made. This may eliminate extra logic for making state transition decisions and, therefore, most likely permit Control Unit 314 to run at higher frequencies and improve the overall performance of Decompressor 104.

Having introduced the innovative features of unpacker processor module 302 above, FIGS. 6–13 illustrate flow charts for example methods associated with extracting code-words from an LZW Compressed Data Stream 108 in accordance with States 0–7. In FIGS. 6–13, load register 408 is abbreviated as "LR", shift register 410 is abbreviated as "SR", and code-word is abbreviated as "CW."

Figure 6:
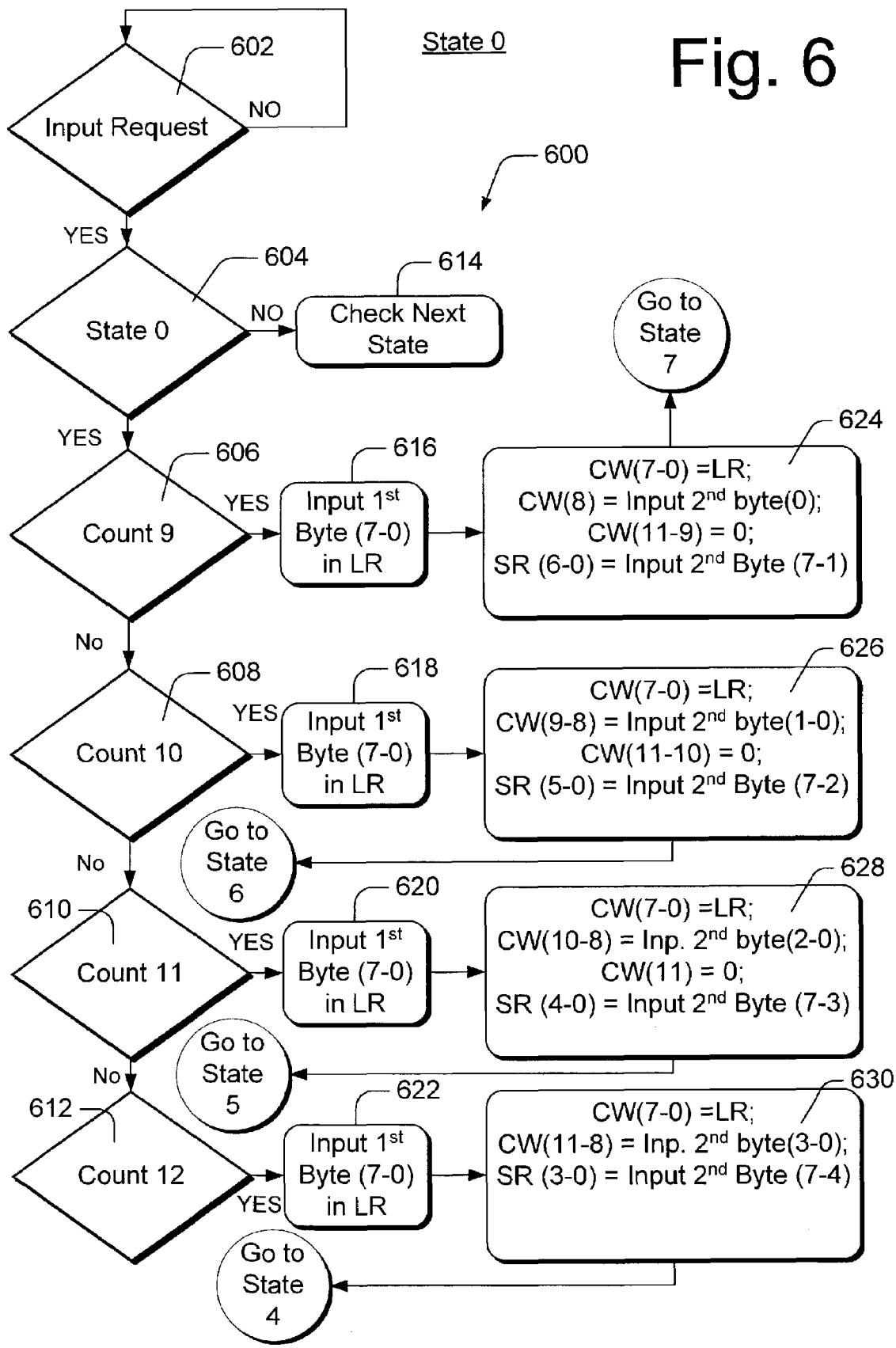
FIGS. 6–13 illustrate flow charts for example methods associated with extracting code-words from an LZW Compressed Data Stream.

FIG. 6 is a flow chart of an example method 600 illustrating how unpacker-processing module 302 performs operations when state machine 418 invokes State 0. Method 600 includes blocks 602–630. The order in which the method is described is not intended to be construed as a limitation. Furthermore, the method can be implemented in one or more processing modules and any type of hardware, firmware, or combination thereof. For ease of explanation, and not limitation, the method of FIG. 6, shall be developed with continued reference to FIGS. 1–5.

In decisional block 602, method 600 waits for unpacker processing module 302 to receive an input request from another device, such as an input buffer (not shown) in decompressor 104, indicating that compressed data from an LZW compressed data stream 108 is available. If no data is available, then, according to the NO branch of decisional block 602, method 600 will wait until compressed data is available. On the other hand, if data is available, then, according to the YES branch of decisional block 602, method 600 proceeds to decisional block 604.

In decisional block 604, a determination is made whether state machine 418 is in State 0. If state machine 418 is not in State 0, then, according to the NO branch of decisional block 602, method 600 proceeds to block 614 and check the next State, e.g., State 1 (shown in FIG. 7). On the other hand, if state machine 418 is in State 0, then, according to the YES branch of decisional block 604, method 600 proceeds to decisional block 606.

In decisional block 606, a determination is made whether counter 416 is counting 9-bit code-words from the LZW compressed data stream 108. Again, as described above, there are a known number of 9, 10, 11, and 12 bit code-words. If counter 416 is counting 9-bit codewords, then, according to the YES branch of decisional block 606, method 600 proceeds to block 616.

In block 616, a first byte (8-bits or bits 7–0) of a next 9-bit code-word is is received by data path 308. Control unit 324 uses multiplexer 412 to direct this byte to be loaded into load register 408. The operation performed in block 616 is performed in a first cycle.

Method 600 proceeds to block 624 and, in a next cycle, performs four operations concurrently, which are each represented as separate lines in block 624, respectively. (Operation 1) Referring to the first line of block 624, the first byte stored in load register 408 (LR) from the previous cycle is transmitted to the output path 404 to comprise part of a 9-bit code-word.

(Operation 2) Referring to the second line of block 624, a second byte is transmitted to the input path 402 and the LSB (Least Significant Bit) (the bit in position 0) is selected by the control unit 314 to pass to the out path 404 and become the MSB (Most Significant Bit) (i.e. CW (8) of the 9-bit code word). This is referred to as concatenating a portion of bits received in a first cycle from the LZW compressed data stream with a portion of bits from the LZW compressed data stream received in a second cycle. The "portion" referred to herein may include any portion of bits ranging from an entire byte to a single bit.

(Operation 3) Referring to the third line of block 624, since data path 404 is 12 bits wide, the remaining bits 11–9 (3 bits in front of the MSB position of a nine-bit code-word) are padded, meaning they are filled with valueless zeros. Thus, for this example, bits 11, 10 and 9 are zeros, whereas bits 8–0 are valued bits comprising part of a 9-bit code word that are collectively transferred from unpacker-processing module 302 to dictionary-processing module 304.

(Operation 4) Referring to the fourth line of block 624, the remaining bits (bit positions 7–1 of the second byte) received during the second cycle are loaded into shift register 410 in bit positions 6–0. These bits remain in shift register 624 until a next cycle, in which they may be concatenated with another portion of bits received from the next byte of LZW compressed data.

Figure 13:
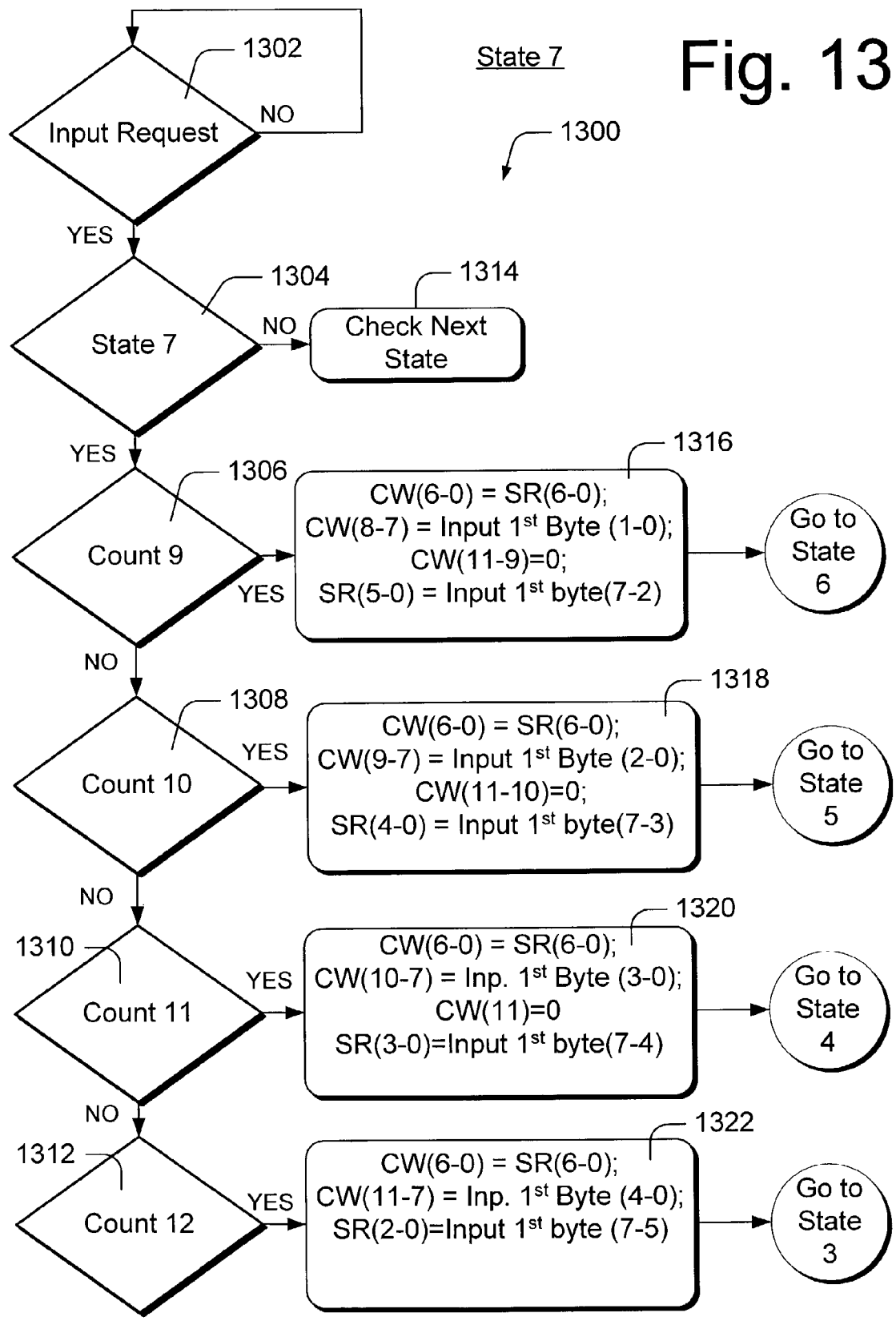

Since seven bits were stored in shift register 410 at completion of block 624, method 600 proceeds to State 7, shown in FIG. 13. So, at completion of the aforementioned operations in block 624 (operations 1–4), method 600 proceeds to a new process 1300 corresponding to State 7 depicted in FIG. 13. This is also reflected in Table 500 with reference to pattern 502 shown in FIG. 5 described above.

Referring back to decisional block 606, if counter 416 is not counting 9-bit code-words, then, according to the NO branch of decisional block 606, method 600 proceeds to block 608. In decisional block 608, a determination is made whether counter 416 is counting 10-bit code words. If, according to the YES branch of decisional block 608, counter 416 is counting 10-bit code-words, then method 600 proceeds to block 618.

In block 618, a first input byte comprising part of a next 10-bit code-word is received by data path 308. The byte is loaded into load register 408 for use during a next cycle.

Method 600 proceeds to block 626 and, in a next cycle, performs four operations concurrently, which are each represented as separate lines in blocks 626, respectively. (Operation 1) Referring to the first line of block 626, the first byte stored in load register 408 (LR) from the previous cycle is transmitted to the output path 404 to comprise part of a 10-bit code-word.

(Operation 2) Referring to the second line of block 626, a second byte is transmitted to the input path 402 and two of the LSBs (bits in positions 0 and 1) are selected by the control unit 314 to pass to the output path 404 and become the two MSBs (i.e. CW (9–8) of the 10-bit code word. In other words, a portion of bits received in a first cycle from the LZW compressed data stream is concatenated with a portion of bits from the LZW compressed data stream received in a second cycle. In this example, bits from load register 408 from Operation 1 in the previous cycle are combined with bits from the next byte received during the current cycle.

(Operation 3) Referring to the third line of block 626, since data path 404 is 12 bits wide, the remaining bits 11–10, (two bits in front of the MSB position of the ten-bit code-word) are padded, meaning they are filled with valueless zeros. Thus, for this example, bits 11, and 10 are zeros, whereas bits 9–0 are valued bits comprising part of a 10-bit code word that are collectively transferred from unpacker-processing module 302 to dictionary-processing module 304.

(Operation 4) Referring to the fourth line of block 626, the remaining bits (bit positions 7–2 of the byte received during the present cycle) are loaded into shift register 410 in bit positions 5–0. These bits remain in shift register 624 until a next cycle, in which they may be concatenated with another portion of bits received from the next byte of LZW compressed data.

Figure 12:
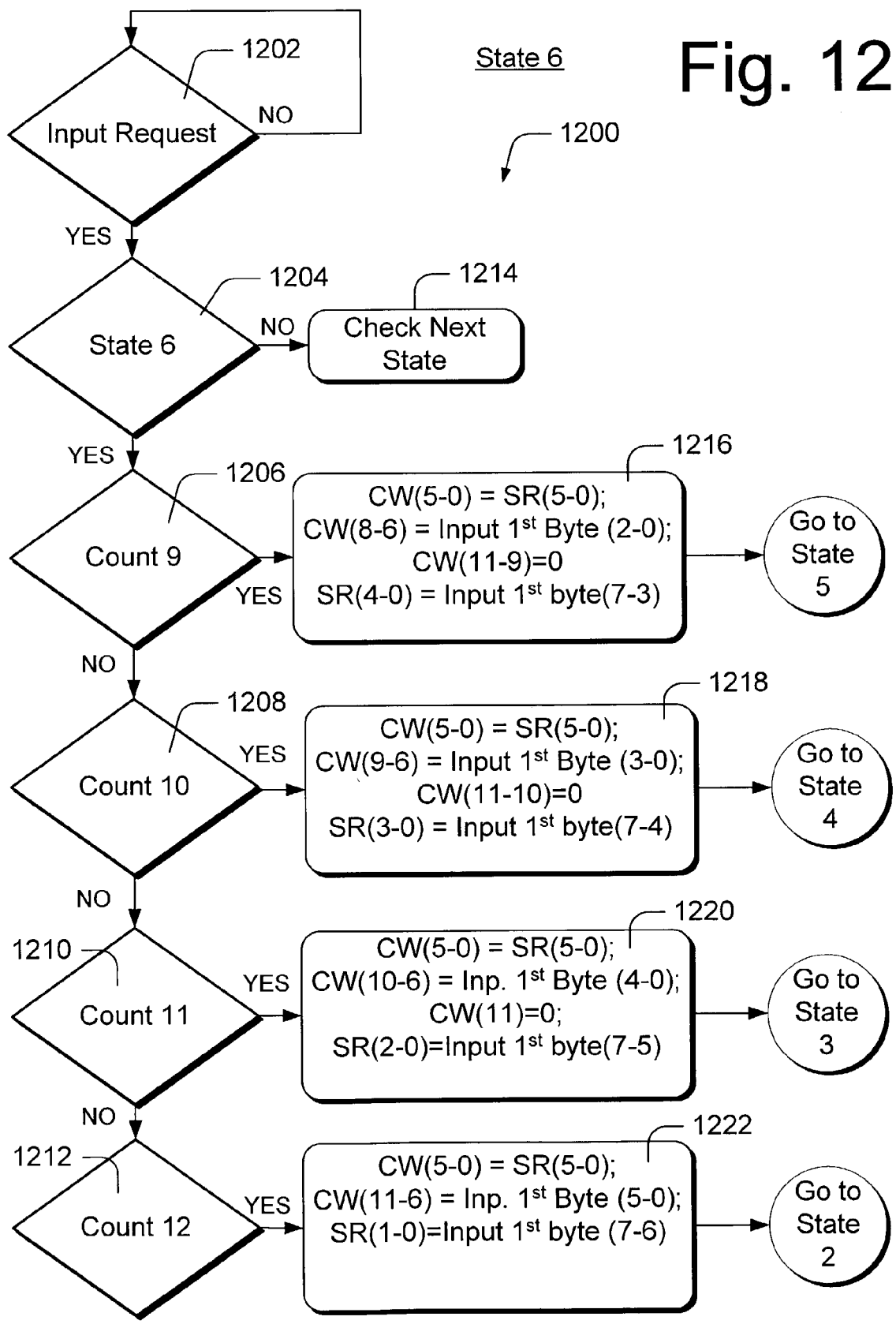

Since six bits were stored in shift register 410 at completion of block 626, method 600 proceeds to State 6, shown in FIG. 12. Accordingly, at completion of the aforementioned operations in block 626 (operations 1–4), method 600 proceeds to a new method 1200 corresponding to State 6 depicted in FIG. 12. This is also reflected in Table 500 with reference to pattern 502 shown in FIG. 5 described above.

Referring back to decisional block 608, if counter 416 is not counting 10-bit code-words, then, according to the NO branch of decisional block 608, method 600 proceeds to block 610. In decisional block 610, a determination is made whether counter 416 is now counting 11-bit code words. If, according to the YES branch of decisional block 610, counter 416 is counting 11-bit code-words, then method 600 proceeds to block 620.

In block 620, a first input byte comprising part of a next 11-bit code-word is received by data path 308. The byte is loaded into load register 408 for use during a next cycle.

Method 600 proceeds to block 628 and in a next cycle, performs four operations concurrently, which are each represented as separate lines in blocks 628, respectively. (Operation 1) Referring to the first line of block 628, the first byte stored in load register 408 (LR) from the previous cycle is transmitted to the output path 404 to comprise part of the 11-bit code-word.

(Operation 2) Referring to the second line of block 628, a second byte is transmitted to the input path 402 and three of the LSBs (bits in positions 0 through 2) are selected by the control unit 314 to pass to the output path 404 and become the three MSBs (i.e. CW (10–8) of the 11-bit code word). In other words, a portion of bits received in a first cycle from the LZW compressed data stream is concatenated with a portion of bits from the LZW compressed data stream received in a second cycle. In this example, bits from load register 408 from Operation 1 in the previous cycle are combined with bits from the next byte received during the current cycle.

(Operation 3) Referring to the third line of block 628, since data path 404 is 12 bits wide, the remaining bit 11 (MSB position in front of the 11-bit code-word) is padded, meaning the position is filled with a valueless zero. Thus, for this example, bit 11 is zero, whereas bits 10–0 are valued bits comprising part of an 11-bit code word that are collectively transferred from unpacker-processing module 302 to dictionary-processing module 304.

(Operation 4) Referring to the fourth line of block 628, the remaining bits (bit positions 7–3 of the byte received during the present cycle) are loaded into shift register 410 in bit positions 4–0. These bits remain in shift register 410 until a next cycle, in which the may be concatenated with another portion of bits received from the next byte of LZW compressed data.

Figure 11:
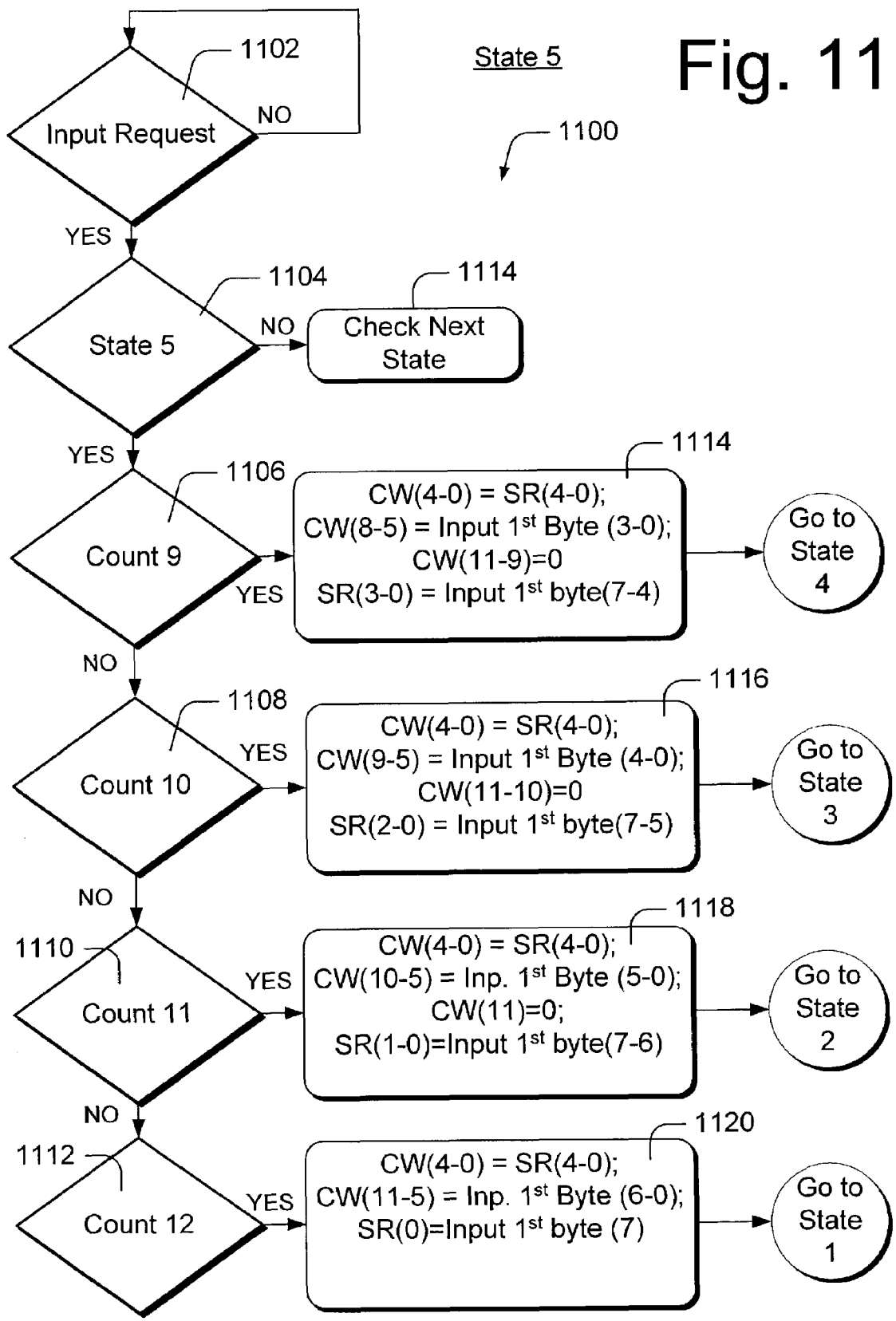

Since five bits were stored in shift register 410 at completion of block 628, method 600 proceeds to State 5, shown in FIG. 11. Accordingly, at completion of the aforementioned operations in block 628 (operations 1–4), method 600 proceeds to a new method 1100 corresponding to State 5 depicted in FIG. 11. This is also reflected in Table 500 with reference to pattern 502 shown in FIG. 5 described above.

Referring back to decisional block 610, if counter 416 is not counting 11-bit code-words, then, according to the NO branch of decisional block 610, method 600 proceeds to block 612. In decisional block 612, a determination is made whether counter 416 is now counting 12-bit code words. If, according to the YES branch of decisional block 612, counter 416 is counting 12-bit code-words, then method 600 proceeds to block 622.

In block 622, a first input byte comprising part of a next 12-bit code-word is received by data path 308. The byte is loaded into load register 408 for use during a next cycle.

Method 600 proceeds to block 630, and in a next cycle, performs three operations concurrently, which are each represented as separate lines in block 630, respectively. (Operation 1) Referring to the first line of block 630, the first byte stored in load register 408 (LR) from the previous cycle is transmitted to the output path 404 to comprise part of the 12-bit code-word.

(Operation 2) Referring to the second line of block 628, a second byte is transmitted to the input path 402, and four of the LSBs (bits in positions 0–3) are selected by the control unit 314 to pass to the output path 404 and become the MSBs (i.e. CW (11–8) of the 12-bit code word). In other words, a portion of bits received in a first cycle from the LZW compressed data stream is concatenated with a portion of bits from the LZW compressed data stream received in a second cycle. In this example, bits from load register 408 from Operation 1 in the previous cycle are combined with bits from the next byte received during the current cycle. Note, no padding is necessary since this is a 12-bit code-word.

(Operation 3) Referring to the fourth line of block 630, the remaining bits (bit positions 7–4 of the byte received during the present cycle) are loaded into shift register 410 in bit positions 3–0. These bits remain in shift register 624 until a next cycle, in which the may be concatenated with another portion of bits received from the next byte of LZW compressed data.

Figure 10:
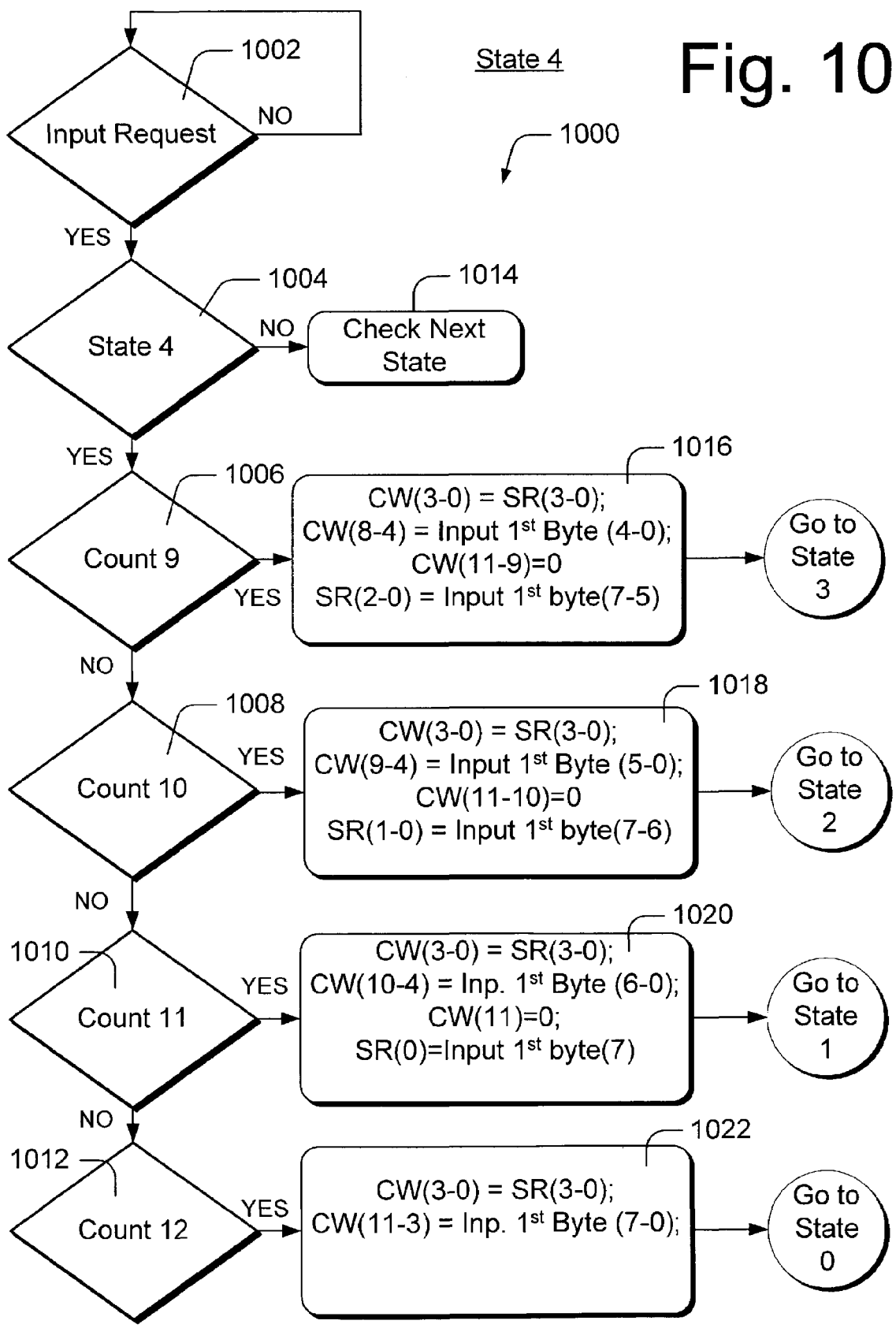

Since four bits were stored in shift register 410 at completion of block 630, method 600 proceeds to State 4, shown in FIG. 10. Accordingly, at completion of the aforementioned operations in block 630 (operations 1–3), method 600 proceeds to a new method 1000 corresponding to State 4 depicted in FIG. 10. This is also reflected in Table 500 with reference to pattern 502 shown in FIG. 5 described above. This completes the discussion of method 600 with respect to State 0 of state machine 418 and unpacker-processing module 302.

Figure 7:
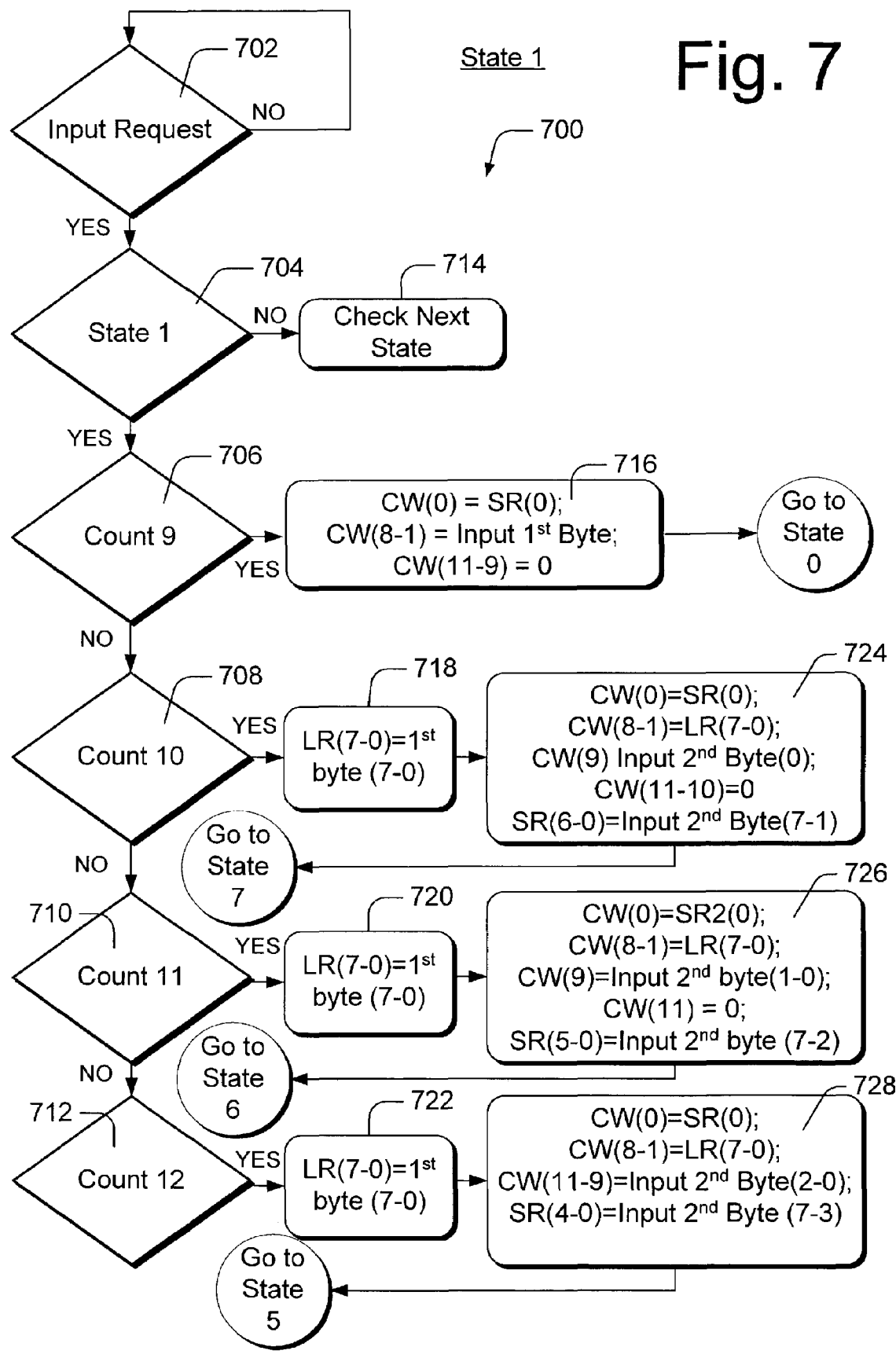

FIG. 7 is a flow chart of an example method 700 illustrating how unpacker-processing module 302 performs operations when state machine 418 invokes State 1. Method 700 includes blocks 702–728. The order in which the method is described is not intended to be construed as a limitation. Furthermore, the method can be implemented in one or more processing modules and any type of hardware, firmware, or combination thereof. Operations depicted in blocks 724, 726, and 728 (like operations 624, 626, 628, and 630 performed in FIG. 6) are performed concurrently and in parallel. Additionally, each of these blocks 724, 726 and 728, if invoked, is performed during a second cycle when a second byte forming a portion of a code-word is selected from the input path 402. Operations performed in blocks 718, 720, 722 are performed during a first cycle when a first byte forming a portion of a code-word is selected from the input path 402. Abbreviations and descriptions used in FIG. 7 are similar to those used in FIG. 6 and described above. For a more detailed understanding of the particular operations performed in blocks 702–728 with respect to State 1, please refer to FIG. 7.

Figure 8:
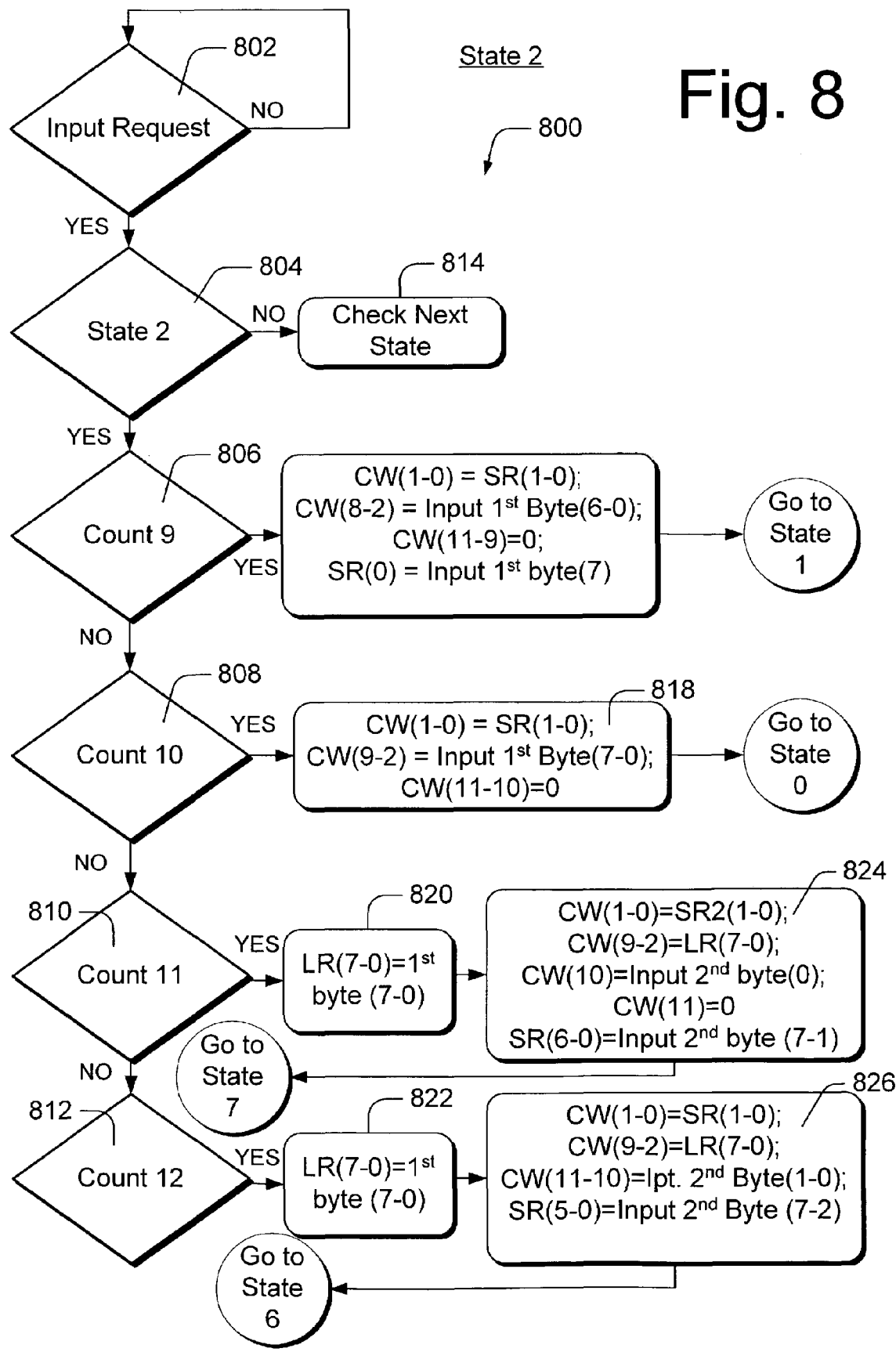

FIG. 8 is a flow chart of an example method 800 illustrating how unpacker-processing module 302 performs operations when state machine 418 invokes State 2. Method 800 includes blocks 802–826. The order in which the method is described is not intended to be construed as a limitation. Furthermore, the method can be implemented in one or more processing modules and any type of hardware, firmware, or combination thereof. Operations depicted in blocks 824, and 826 (like operations 624, 626, 628, and 630 performed in FIG. 6) are performed concurrently and in parallel. Additionally, each of these blocks 824 and 826, if invoked, is performed during a second cycle when a second byte forming a portion of a code-word is selected from the input path 402. Operations performed in blocks 816, 818, 820, and 822 are performed during a first cycle when a first byte forming a portion of a code-word is selected from the input path 402. Abbreviations and descriptions used in FIG. 8 are similar to those used in FIG. 6 and described above. For a more detailed understanding of the particular operations performed in blocks 802–826 with respect to State 2, please refer to FIG. 8.

Figure 9:
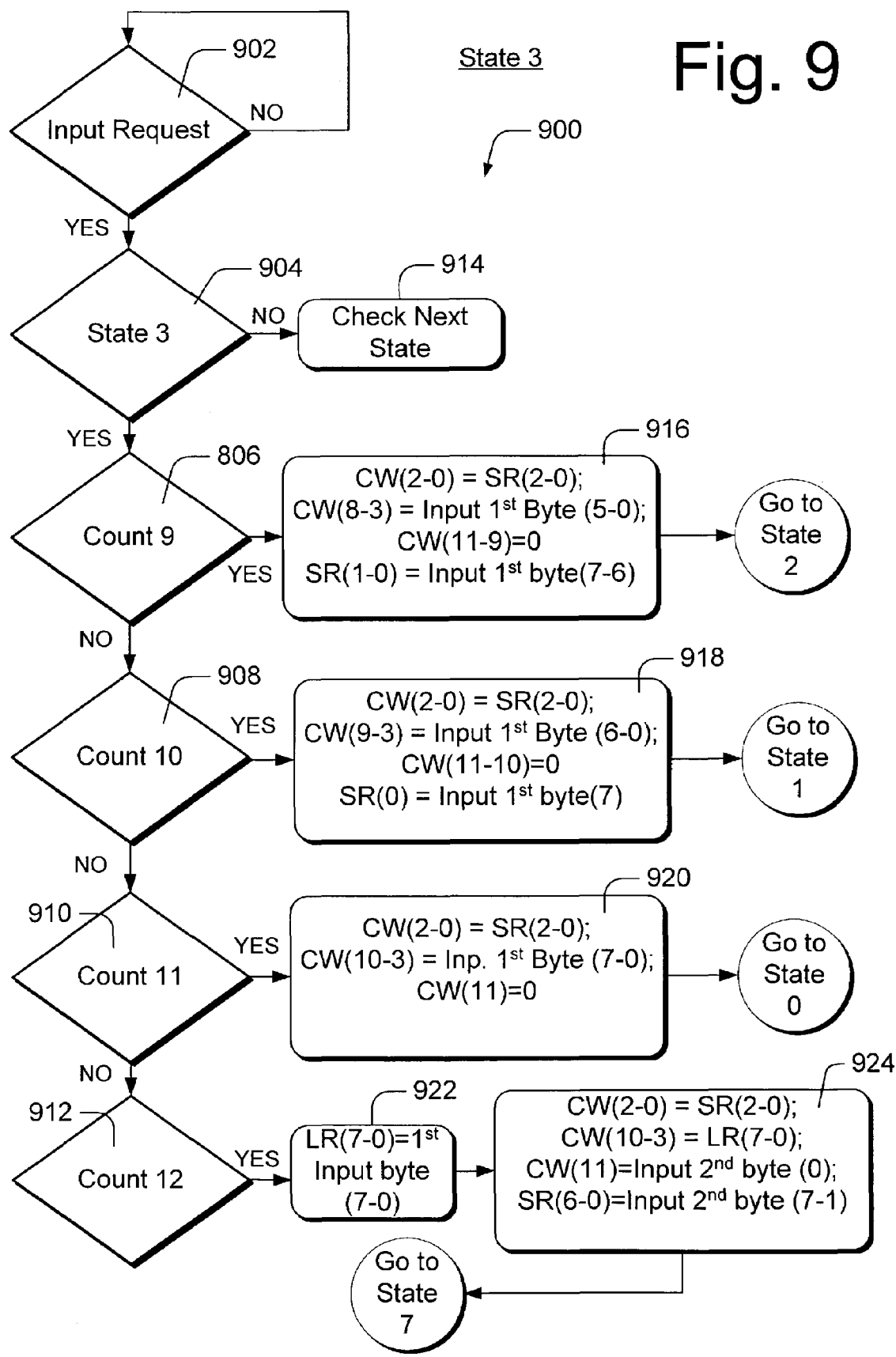

FIG. 9 is a flow chart of an example method 900 illustrating how unpacker-processing module 302 performs operations when state machine 418 invokes State 3. Method 900 includes blocks 902–924. The order in which the method is described is not intended to be construed as a limitation. Furthermore, the method can be implemented in one or more processing modules and any type of hardware, firmware, or combination thereof. Operations depicted in block 924 (like operations 624, 626, 628, and 630 performed in FIG. 6) are performed concurrently and in parallel. Additionally, if block 924 is invoked, it is performed during a second cycle when a second byte forming a portion of a code-word is selected from the input path 402. Operations performed in blocks 916, 918, 920, and 922 are performed during a first cycle when a first byte forming a portion of a code-word is selected from the input path 402. Abbreviations and descriptions used in FIG. 9 are similar to those used in FIG. 6 and described above. For a more detailed understanding of the particular operations performed in blocks 902–924 with respect to State 3, please refer to FIG. 9.

FIG. 10 is a flow chart of an example method 1000 illustrating how unpacker-processing module 302 performs operations when state machine 418 invokes State 4. Method 1000 includes blocks 1002–1022. The order in which the method is described is not intended to be construed as a limitation. Furthermore, the method can be implemented in one or more processing modules and any type of hardware, firmware, or combination thereof. Operations performed in blocks 1016, 1018, 1020, and 1022 are performed during a first cycle when a first byte forming a portion of a code-word is selected from the input path 402. Abbreviations and descriptions used in FIG. 10 are similar to those used in FIG. 6 and described above. For a more detailed understanding of the particular operations performed in blocks 1002–1022 with respect to State 4, please refer to FIG. 10.

FIG. 11 is a flow chart of an example method 1100 illustrating how unpacker-processing module 302 performs operations when state machine 418 invokes State 5. Method 1100 includes blocks 1102–1120. The order in which the method is described is not intended to be construed as a limitation. Furthermore, the method can be implemented in one or more processing modules and any type of hardware, firmware, or combination thereof. Operations performed in blocks 1114, 1116, 1118, and 1120 are performed during a first cycle when a first byte forming a portion of a code-word is selected from the input path 402. Abbreviations and descriptions used in FIG. 11 are similar to those used in FIG. 6 and described above. For a more detailed understanding of the particular operations performed in blocks 1102–1120 with respect to State 5, please refer to FIG. 11.

FIG. 12 is a flow chart of an example method 1200 illustrating how unpacker-processing module 302 performs operations when state machine 418 invokes State 6. Method 1200 includes blocks 1202–1222. The order in which the method is described is not intended to be construed as a limitation. Furthermore, the method can be implemented in one or more processing modules and any type of hardware, firmware, or combination thereof. Operations performed in blocks 1216, 1218, 1220, and 1222 are performed during a first cycle when a first byte forming a portion of a code-word is selected from the input path 402. Abbreviations and descriptions used in FIG. 12 are similar to those used in FIG. 6 and described above. For a more detailed understanding of the particular operations performed in blocks 1202–1122 with respect to State 6, please refer to FIG. 12.

FIG. 13 is a flow chart of an example method 1300 illustrating how unpacker-processing module 302 performs operations when state machine 418 invokes State 7. Method 1300 includes blocks 1302–1322. The order in which the method is described is not intended to be construed as a limitation. Furthermore, the method can be implemented in one or more processing modules and any type of hardware, firmware, or combination thereof. Operations performed in blocks 1316, 1318, 1320, and 1322 are performed during a first cycle when a first byte forming a portion of a code-word is selected from the input path 402. Abbreviations and descriptions used in FIG. 13 are similar to those used in FIG. 6 and described above. For a more detailed understanding of the particular operations performed in blocks 1302–1322 with respect to State 7, please refer to FIG. 13.

Exemplary Dictionary-Processing Module 304

Figure 14:
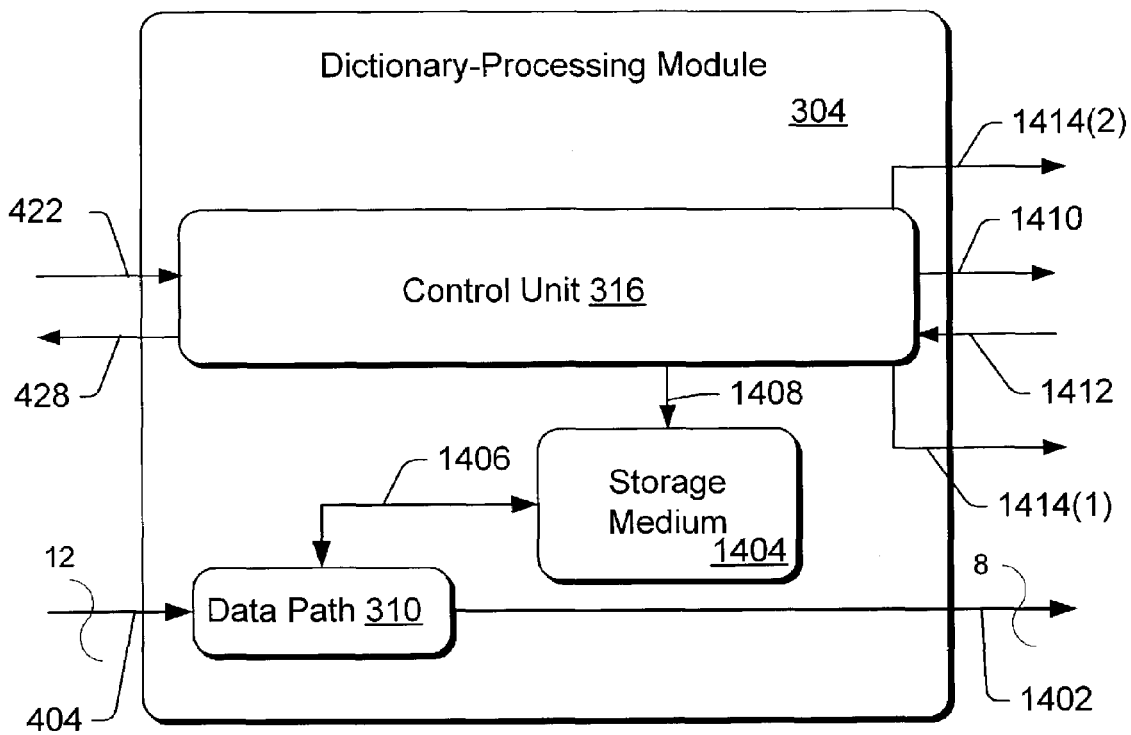
FIG. 14 is a block diagram of dictionary-processing module 304 shown in FIG. 3.

FIG. 14 is a block diagram of dictionary-processing module 304 shown in FIG. 3. Dictionary-processing module 304 includes a data path 310 and control unit 316. In the exemplary implementation, both the control unit 316 and data path 310 are implemented in a FPGA but could easily be implemented in other hardware configurations as described above. Data path 310 includes an input path 404 (from unpacker-processing module 302) and an output path 1402. Input path 404 is 12 bits wide and output path 1402 is 8-bits wide. Other sized paths, larger or smaller, could also be implemented.

Dictionary-processing module 304 also includes a storage medium 1404. In one implementation storage medium 1404 is implemented as a volatile memory device, such as a RAM (random access memory), or SRAM (static-RAM). Other types of media used to implement storage medium 1404, such as flash memory or various other types of memory media. In an alternative implementation, storage medium 1404 may be located external to dictionary-processing module 304.

In the exemplary implementation, storage medium 1404 is connected to data path 310 via a two-way bus 1406 on which data may flow in and out of storage medium 1404. An address control line 1408 from control unit 316 provides a basis to control reading and writing of data to and from storage medium 1404.

Control unit 316 includes handshaking control signals to control receipt of extracted code-words from unpacker-processing module 302 and to control transmission of a decoded data stream 110 (one or more strings) to stack-processing module 306. In particular, an active request signal 426 indicates when data is available from unpacking-processing module 302. An active request signal 1410 indicates when data is available from dictionary-processing module 304 for stack-processing module 306. An active acknowledge signal 428 indicates when dictionary-processing unit 304 successfully receives data from processing module 302. An active acknowledge signal 1412, indicates when stack-processing module 306 receives a string of data. Control unit 316 includes string control signals 1414(1) and 1414(2). An active start of string signal 1414(1) indicates to the stack-processing module 306 when the first byte of a new string is about to be sent from output path 1402 and an active end of string signal 1414(2) indicates to the stack-processing module 306 when the last byte of a string is about to be sent.

Dictionary-processing module 304 is configured to generate a "dictionary" (FIG. 15) to decode code-words associated with the compressed data and store the dictionary in storage medium 1404. Once the dictionary is created, dictionary-processing module 304 is configured to use the dictionary to decode code-words received from the unpacker-processing module 302, by referencing the dictionary.

Figure 15:
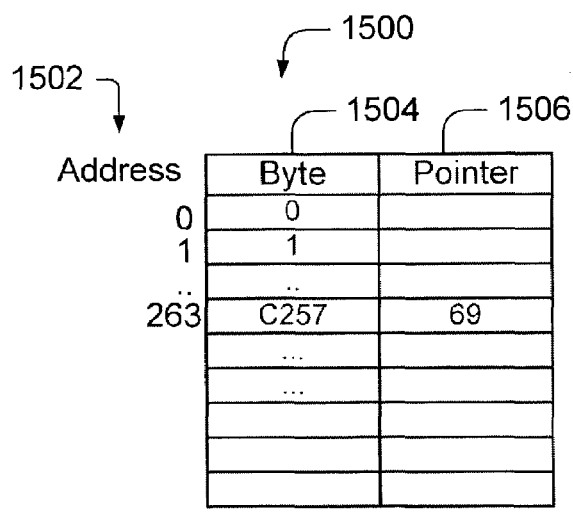
FIG. 15 is a graphical illustration of a sample dictionary (i.e., data structure) suitable for use by the dictionary-processing module.

FIG. 15 is a graphical illustration of a sample dictionary (i.e., data structure) 1500 suitable for use by dictionary-processing module 304. As mentioned above, control unit 316 maintains dictionary 1500, which is typically stored on storage medium 1404. In this example, there are two fields at each address 1502 of the dictionary 1500: a byte value field 1504; and a pointer value field 1506 (often referred to in the art as a "prefix.") Byte values stored in byte value field 1504 may be a root or an actual value of a string. Pointer values stored in pointer value field 1506 may be a link to another location in the Dictionary represented by the addressed field 1502 and/or a value portion (or "prefix") of a string. Also, in the exemplary implementation, the data structure configured as dictionary 1500 may hold a maximum of 4K bytes, however, in other implementations it is possible for the size of the dictionary to be larger or smaller.

As appreciated by those familiar with the LZW algorithm, the first 256 entries to the dictionary would be initialized to pre-known values. In the first 256 entries of the dictionary, the value stored in the byte value field 1504 is the same as the address of that field 1502. Also, in the first 256 entries of the dictionary, the value stored in the pointer value field 1506 is empty or null. FIG. 15 shows an example: at address 0 the byte value field is 0 and the pointer value field is empty; at address 1 the byte value field is 1 and the pointer value field is empty. In the exemplary implementation, when the dictionary-processing module 304 builds the dictionary, to reduce initialization time and space in the storage medium 1404, it does not enter a value in the byte value field 1504 for the first 256 address locations. The dictionary-processing module 304 takes advantage of the fact that the byte values filed 1504 in the dictionary 1500 is the same as the address 1502. Accordingly, instead of reading the byte value field out of the storage medium 1404 for addresses less then 256, the dictionary-processing module 304 "knows" that the byte value is the same as the address. This improves performance of the dictionary-controller module 304 by reducing the number of reads needed from the storage medium 1404. However, most of the increases in the performance are due to the fact that memory writes cycles to the 256 locations are not performed every time a new dictionary is configured.

It should be noted, that, in one implementation, strings are read from the dictionary 1500 in reverse order LSB byte-to-MSB byte. The reason why the string must be read in reverse order is due to the nature of the of the LZW compression Algorithm. During the LZW compression, linked lists of strings are stored into the dictionary 1500 (note in decompression the same dictionary is rebuilt as existed in compression), such that the strings are always stored into the dictionary in an ascending manner. For example, if a the MSB, byte 1, is stored in address X, then byte 2 will be stored at a address greater than X. This continues until the end of the string, or LSB. As a result, every successive byte in the string is guaranteed to be stored at an address 1502 greater then location of the previous byte 1504. Thus, when the LZW Decompressor dictionary-processing module 304 is attempting to re-build the uncompressed string, it will read from the end of the string byte (LSB) to the beginning of the string (MSB). It uses the pointer value 1506 to read the previous byte value 1504 in the string.

Exemplary Stack-Processing Module 306

Figure 16:
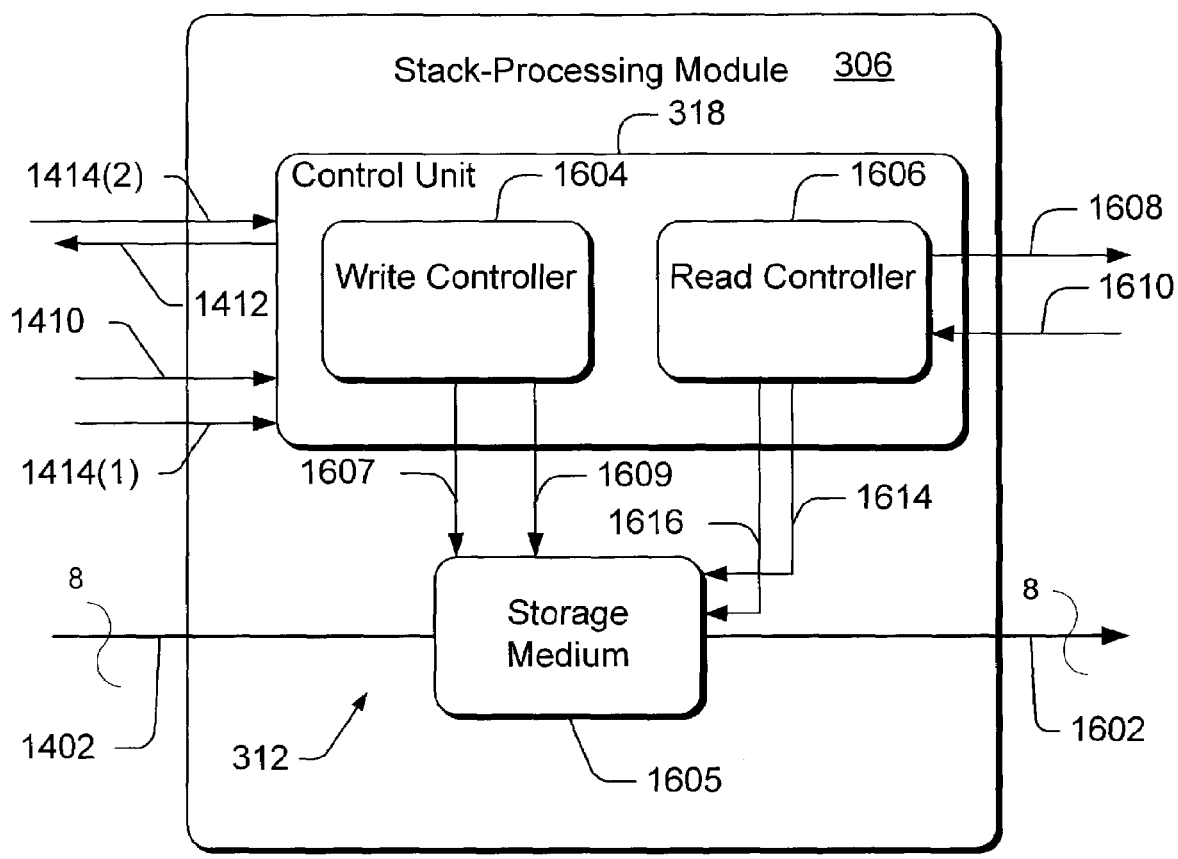
FIG. 16 is a block diagram of a stack-processing module shown in FIG. 3.

FIG. 16 is a block diagram of stack-processing module 306 shown in FIG. 3. As the final stage of decompressor 104, in one exemplary implementation stack-processing module 306 performs operations associated with buffering decoded data (strings output from dictionary processing module 304) prior to the decoded data being sent to another device. Stack-processing module 306 also assembles the decoded data (strings) in an order that matches uncompressed data prior to being compressed. In other words, stack-processing module 306 receives strings in an order from the LSB byte to MSB byte. Accordingly, stack-processing module 306 reverses this order by (1) storing a string received from dictionary-processing module and (2) reading the string out from the MSB byte-to-LSB byte.

Stack-processing module 306 includes a data path 312 and control unit 318. Data path 312 includes an input path 1402, which is the same as the output path from dictionary processing module 304. Input data path 1402 is configured to receive 8-bits of data at a time. Data path 312 also includes an output path 1602, with a data width of 8-bits. Other sized data widths, larger or smaller, for the input path 1402 and output path 1602 are possible.

Data path 312 also includes a storage medium 1605, also referred to as the "stack." In the exemplary implementation, storage medium 1605 is a dual port block RAM, however, other storage mediums are possible, including but not limited to, SRAMs, flash, and so forth. As a dual port block RAM, data may be received and stored at the same time data is being transmitted from the storage medium. Storage medium 1605 is configured to hold up to several variable length byte strings up to 4K bytes in length. Accordingly, while one string is being stored in storage medium 1605, another previously stored string may be read out of the storage medium, simultaneously, as part of the decoded data stream 110.

Control unit 318 includes a write controller 1604 and a read controller 1606. Write controller 1604 communicates with dictionary-processing module 304 via handshaking signals described above including: request signal 1410; acknowledge signal 1412; start of string signal 1414(1); and end of string signal 1414(2). Write controller 1604 allocates stacks (addresses where to store strings having start and end addresses) in storage medium 1605 via a write address line 1607. Write controller 1604 also enables a write operation via a write enable line 1609.

Read controller 1606 uses handshaking signals, including a stack request signal 1608 and stack acknowledge signal 1610, to communicate with another device (not shown) to transmit decoded data stream 110. When stack-request signal 1608 is activated, it indicates to another device that a string is available to be sent from storage medium 1604 as soon as the other device acknowledges that it is ready to receive data via an active stack acknowledge signal 1610. Read controller 1606 indicates where to read data out of storage medium 1605 via a read address line 1614. Read controller 1606 also enables read operations via a read enable line 1616.

Figure 17:
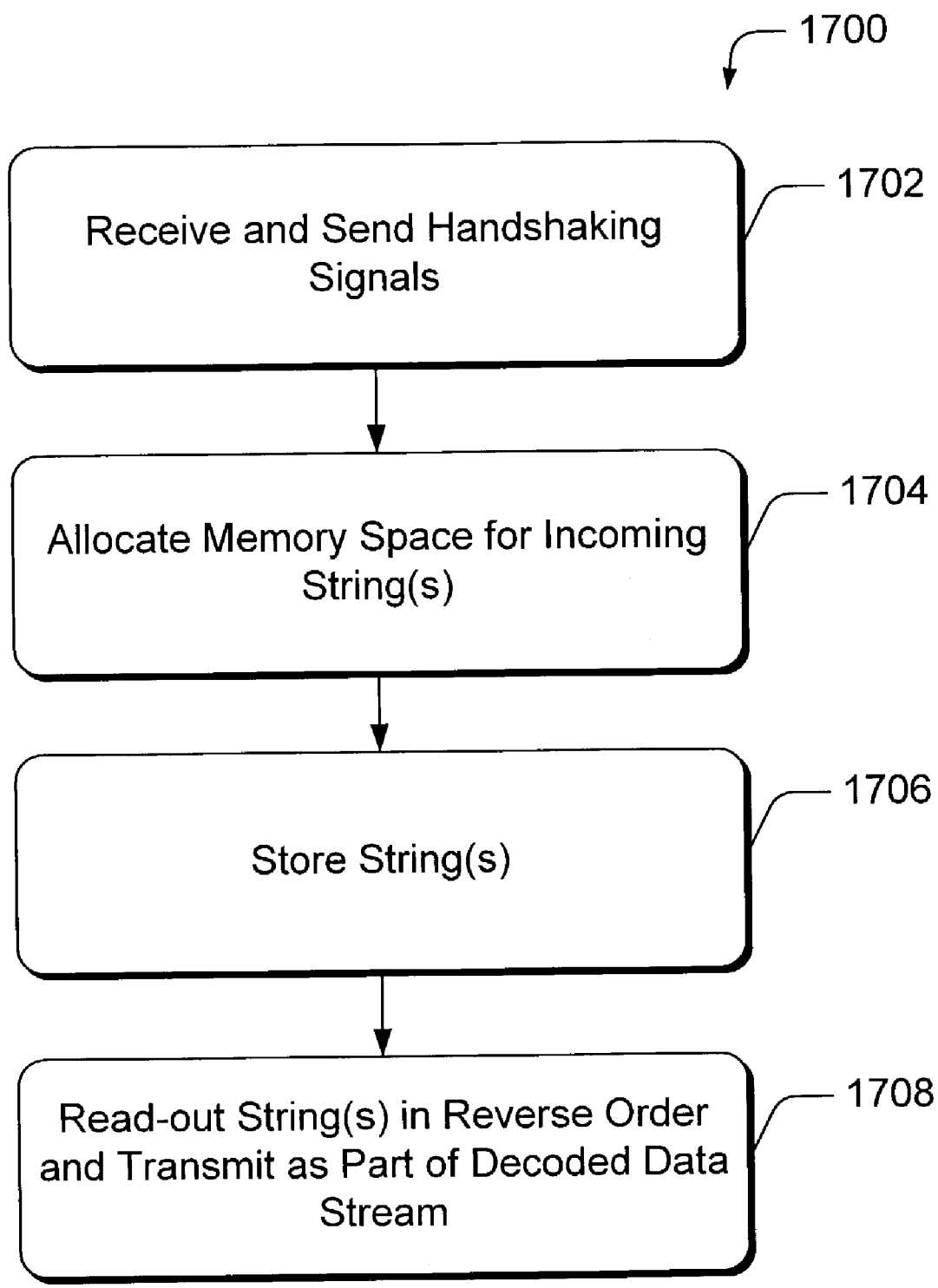
FIG. 17 illustrates a flow chart of an example method used with buffering decoded data prior to the decoded data being sent to an external device.

Having introduced the innovative features of stack-processing module 306 above, FIG. 17 illustrates a flow chart of an example method 1700 used with buffering decoded data prior to the decoded data being sent to an external device. Method 1700 also described how stack-processing module 306 assembles decoded data so that the decoded data matches the compressed data prior to the data being compressed by some type of LZW compression algorithm. Method 1700 includes blocks 1702–1708. The order in which the method is described is not intended to be construed as a limitation. Furthermore, the method can be implemented in one or more processing modules and any type of hardware, firmware, or combination thereof. For ease of explanation, and not limitation, the method of FIG. 17, shall be developed with continued reference to several previous Figures.

In block 1702, stack-processing module 306 receives active start string, end string and request to send data from dictionary-processing module 304. In block 1704, stack-processing module 306 allocates memory space (start address), for the incoming string and sends an acknowledge signal. In block 1706, stack-processing module 306 writes the string into storage medium 1605. Each input byte received by the stack-processing module 306 is stored in the storage medium until the end string 1414(2) is active. At that point the end address of the string is recorded. In block 1708, the string is read-out of the storage medium in the reverse order it was received, from the end address to the start address, forming part of decoded data stream 110.

Although some implementations of the various methods and arrangements of the present invention have been illustrated in the accompanying Drawings and described in the foregoing Detailed Description, it will be understood that the invention is not limited to the exemplary aspects disclosed, but is capable of numerous rearrangements, modifications and substitutions without departing from the spirit of the invention as set forth and defined by the following claims.

What is claimed is:

1. An apparatus, comprising: processing modules configured to decompress compressed data using LZW (Lempel-Ziv-Welch) data decompression by: (i) segmenting operations associated with decompressing the compressed data into stages, wherein one of the stages includes operations associated with unpacking code-words from the compressed data, and (ii) for each particular stage, assigning one or more of the processing modules to perform operations appurtenant to that particular stage and collectively decompress the compressed data, wherein each processing module is implemented in hardware and configured to operate independently with respect to the operations appurtenant to that processing module, and wherein at least one of the processing modules is assigned to perform the operations associated with unpacking the code-words.

2. The apparatus as recited in claim 1, wherein each of the processing modules includes a control unit and a data path.

3. The apparatus as recited in claim 1, wherein one of the stages includes operations associated with generating a dictionary to decode code-words associated with the compressed data.

4. The apparatus as recited in claim 1, wherein one of the stages includes operations associated with generating a dictionary to decode code-words associated with the compressed data and wherein at least one of the processing modules is assigned to perform the operations associated with creating the dictionary.

5. The apparatus as recited in claim 1, wherein one of the stages includes operations associated with buffering decoded data prior to the decoded data being sent to an external device.

6. The apparatus as recited in claim 1, wherein one of the stages includes operations associated with buffering decoded data prior to the decoded data being sent to an external device and assembling the decoded data so that the decoded data matches the compressed data prior to being compressed.

7. The apparatus as recited in claim 1, wherein one of the stages includes operations associated with buffering decoded data prior to the decoded data being sent to another device and wherein at least one of the processing modules is assigned to perform the operations associated with buffering the decoded data.

8. The apparatus as recited in claim 1, wherein one of the stages includes operations associated with buffering decoded data prior to the decoded data being sent to another device and assembling the decoded data in an order that matches uncompressed data prior to being compressed and wherein at least one of the processing modules is assigned to perform the operations associated with assembling and buffering the decoded data.

9. The apparatus as recited in claim 1, wherein the apparatus is an input device for a computer.

10. The apparatus as recited in claim 1, wherein the apparatus is a coprocessor.

11. The apparatus as recited in claim 1, wherein the apparatus is a computer.

12. The apparatus as recited in claim 1, wherein at least one of the processing modules is a field programmable gate array.

13. The apparatus as recited in claim 1, wherein at least one of the processing modules is an application specific integrated circuit (ASIC).

14. The apparatus as recited in claim 1, wherein the processing modules operate concurrently.

15. An apparatus, comprising: processing modules configured to decompress compressed data using LZW (Lempel-Ziv-Welch) data decompression by: (i) segmenting operations associated with decompressing the compressed data into stages, wherein one of the stages includes operations associated with generating a dictionary to decode code-words associated with the compressed data and (ii) for each particular stage, assigning one or more of the processing modules to perform operations appurtenant to that particular stage and collectively decompress the compressed data, wherein each processing module is implemented in hardware and configured to operate independently with respect to the operations appurtenant to that processing module, and wherein at least one of the processing modules is assigned to perform the operations associated with creating the dictionary and decoding the code-words by referencing the dictionary.

16. A system, comprising:
a first processing module comprising a data path located between an input port and output port of the first processing module, configured to receive an LZW compressed data stream containing code-words in increments of X bits of data per cycle, wherein the X bits of data represents a number of bits of data less than the size of a code-word, wherein the code-words are located at arbitrary positions within the LZW compressed data stream, the code-words having variable data bit lengths, and wherein the first processing module is configured to extract code-words from the LZW compressed data stream by monitoring patterns associated with each increment of X bits of data received by the data path per cycle, and, based on those patterns, directing the data path to form a code-word from the compressed data stream for transmission from the output port; and a second processing module comprising a data path configured to (i) receive the code-words extracted by the first processing module, (ii) dynamically reconstruct a dictionary from which the LZW compressed data stream was created, and (iii) use the code-words as an addresses to the dictionary to output a decoded data stream from the dictionary to the data path for transmission.

17. The system as recited in claim 16, wherein the dictionary is a string table stored in a dedicated memory device.

18. The system as recited in claim 16, wherein the second processing module uses request and acknowledge handshaking signals to control receipt of the code-words and transmission of the decoded data stream.

19. The system as recited in claim 16, further comprising a third processing module configured to manage temporary storage and transmission of the decoded data stream.

20. The system as recited in claim 16, wherein at least one of the processing modules is a field programmable gate array.

21. The system as recited in claim 16, wherein at least one of the processing modules is an ASIC.

* * * * *